US012575211B2

(12) United States Patent
Akiyama

(10) Patent No.: US 12,575,211 B2
(45) Date of Patent: Mar. 10, 2026

(54) SEMICONDUCTOR ELEMENT, SEMICONDUCTOR DEVICE, AND METHOD FOR MANUFACTURING SEMICONDUCTOR ELEMENT

(71) Applicant: SONY SEMICONDUCTOR SOLUTIONS CORPORATION, Kanagawa (JP)

(72) Inventor: Kentaro Akiyama, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 382 days.

(21) Appl. No.: 18/248,264

(22) PCT Filed: Oct. 8, 2021

(86) PCT No.: PCT/JP2021/037309
§ 371 (c)(1),
(2) Date: Apr. 7, 2023

(87) PCT Pub. No.: WO2022/080248
PCT Pub. Date: Apr. 21, 2022

(65) Prior Publication Data
US 2023/0378223 A1 Nov. 23, 2023

(30) Foreign Application Priority Data
Oct. 16, 2020 (JP) ................................ 2020-174382

(51) Int. Cl.
*H10F 39/00* (2025.01)
*H10F 39/18* (2025.01)

(52) U.S. Cl.
CPC .......... *H10F 39/811* (2025.01); *H10F 39/011* (2025.01); *H10F 39/182* (2025.01)

(58) Field of Classification Search
CPC ........... H01L 27/14636; H01L 27/1462; H01L 27/14685; H01L 27/14698; H01L 2224/05;
(Continued)

(56) References Cited

U.S. PATENT DOCUMENTS

2010/0109006 A1* 5/2010 Kobayashi .............. H01L 24/05
257/776
2010/0248399 A1 9/2010 Hsieh
(Continued)

FOREIGN PATENT DOCUMENTS

JP 2010-109137 5/2010
JP 2012-033878 2/2012
(Continued)

OTHER PUBLICATIONS

International Search Report and Written Opinion prepared by the Japan Patent Office on Dec. 17, 2021, for International Application No. PCT/JP2021/037309, 3 pgs.

*Primary Examiner* — Jonathan Han
(74) *Attorney, Agent, or Firm* — SHERIDAN ROSS P.C.

(57) ABSTRACT

Bonding strength of a connection portion bonded to a semiconductor element is measured. The semiconductor element includes a semiconductor substrate and a bond pad. In the semiconductor substrate, an element is formed, and a wiring region having a wiring for transmitting a signal of the element is disposed adjacent. The bond pad is disposed in the wiring region adjacent to a semiconductor substrate removal region, which is a region where the semiconductor substrate is removed, connected to the wiring, and bonded with a connection portion for connection to an outside. The semiconductor substrate removal region includes a region for measuring bonding strength of the bond pad and the connection portion.

20 Claims, 19 Drawing Sheets

(58) Field of Classification Search
CPC ..... H01L 2224/48463; H01L 27/14683; H01L 27/14632; H01L 27/1464; H01L 27/14643; H01L 27/14687; H01L 27/14689; H01L 27/14806; H01L 2224/04042; H01L 24/05; H01L 24/80; H01L 22/34; H01L 2224/08145; H10F 39/811; H10F 39/011; H10F 39/182
See application file for complete search history.

(56) References Cited

U.S. PATENT DOCUMENTS

| | | | |
|---|---|---|---|
| 2013/0105924 A1 | 5/2013 | Kobayashi et al. | |
| 2017/0317130 A1 | 11/2017 | Yoshida | |
| 2018/0286910 A1 * | 10/2018 | Kobayashi | H10F 39/802 |
| 2019/0333947 A1 * | 10/2019 | Han | H10F 39/8063 |

FOREIGN PATENT DOCUMENTS

| | | |
|---|---|---|
| JP | 2016-131179 | 7/2016 |
| JP | 2018-170471 | 11/2018 |
| WO | WO 2016/117124 | 7/2016 |

* cited by examiner

FIG.4

SEMICONDUCTOR ELEMENT, SEMICONDUCTOR DEVICE, AND METHOD FOR MANUFACTURING SEMICONDUCTOR ELEMENT

CROSS REFERENCE TO RELATED APPLICATIONS

This application is a national stage application under 35 U.S.C. 371 and claims the benefit of PCT Application No. PCT/JP2021/037309, having an international filing date of 8 Oct. 2021, which designated the United States, which PCT application claimed the benefit of Japanese Patent Application No. 2020-174382, filed 16 Oct. 2020, the entire disclosures of each of which are incorporated herein by reference.

FIELD

The present disclosure relates to a semiconductor element, a semiconductor device, and a method for manufacturing a semiconductor element.

BACKGROUND

In a semiconductor element, a semiconductor element connected to an external circuit by wire bonding is used. This wire bonding is a connection method of bonding a bonding wire to a pad disposed in a wiring region formed on a front surface side of a semiconductor substrate constituting a semiconductor element. Bonding of the bonding wire can be performed by heating and pressing a metal bonding wire against the pad. The bonding wire is bonded from a side different from a surface in contact with the semiconductor substrate.

On the other hand, there has been proposed a semiconductor element in which an opening portion is formed in a semiconductor substrate near a pad to expose the pad, and a bonding wire is bonded to the pad from a back surface side of the semiconductor substrate via the opening portion. For example, in a back surface irradiation type imaging element that images light irradiated to the back surface side of a semiconductor substrate, a lens layer in which a lens for condensing incident light is formed and a flattening film that flattens a base of the lens layer are disposed on the back surface side of the semiconductor substrate. The opening portion of the semiconductor substrate needs to be formed after removing the lens layer and the flattening film. Note that the wire bonding pad is disposed at an end portion of the semiconductor substrate. This is to shorten the bonding wire length. In addition, a scribe line, which is a region on which a dicing blade that singulates the semiconductor substrate from the wafer abuts, is disposed around the wafer-like semiconductor substrate. As the semiconductor element is downsized, a pad for wire bonding is disposed close to a scribe line. The scribe line is a linear groove formed in the semiconductor substrate, and is formed in the semiconductor substrate after the lens layer and the flattening film are removed.

There has been proposed a semiconductor device that simultaneously removes a lens layer and a flattening film in a region where wire bonding is performed and a region where a scribe line is formed (see, for example, Patent Literature 1). In this semiconductor device, the opening portion of the wire bonding and the groove of the scribe line are individually formed in the semiconductor substrate adjacent to the opening portion from which the lens layer and the flattening film have been removed.

CITATION LIST

Patent Literature

Patent Literature 1: JP 2016-131179 A

SUMMARY

Technical Problem

In order to secure the reliability of connection by wire bonding, it is necessary to measure and manage the bonding strength of the pad and the bonding wire. The bonding strength can be measured by a shear strength test in which a bonding wire bonded to a pad is broken to measure strength. This shear strength test is performed by pushing the bonding portion of the bonding wire in a direction parallel to the surface of the semiconductor substrate with a measuring instrument. However, in the above conventional technique, since the bonding portion of the bonding wire is disposed in the opening portion of the semiconductor substrate, there is a problem that the bonding wire cannot be pushed by a measuring instrument and the bonding strength cannot be measured.

Therefore, the present disclosure proposes a semiconductor element, a semiconductor device, and a method for manufacturing the semiconductor element that measure the bonding strength of a bonding wire joined and bonded from the back surface side of a semiconductor substrate.

Solution to Problem

An semiconductor element according to the present disclosure includes: a semiconductor substrate in which an element is formed and a wiring region having a wiring that transmits a signal of the element is disposed adjacent to the semiconductor substrate; and a bond pad disposed in the wiring region adjacent to a semiconductor substrate removal region, which is a region from which the semiconductor substrate has been removed, connected to the wiring, and bonded with a connection portion for connection to outside, wherein the semiconductor substrate removal region includes a region for measuring bonding strength between the bond pad and the connection portion.

And an semiconductor device according to the present disclosure includes: a semiconductor substrate in which an element is formed and a wiring region having a wiring that transmits a signal of the element is disposed adjacent to the semiconductor substrate; a bond pad disposed in the wiring region adjacent to a semiconductor substrate removal region, which is a region from which the semiconductor substrate has been removed, connected to the wiring, and bonded with a connection portion for connection to an outside; and a processing circuit that processes the transmitted signal, wherein the semiconductor substrate removal region includes a region for measuring bonding strength between the bond pad and the connection portion.

And a method for manufacturing a semiconductor element according to the present disclosure includes: a step of disposing a wiring region on a semiconductor substrate on which an element is formed, the wiring region including a wiring that transmits a signal of the element and a bond pad connected to the wiring and to which a connection portion for connection with an outside is bonded; and a step of removing the semiconductor substrate in a region near the bond pad, wherein in the step of removing the semiconductor substrate, the region including a region for measuring bonding strength between the bond pad and the connection portion is removed.

BRIEF DESCRIPTION OF DRAWINGS

FIG. 4 is a view illustrating an example of a shear strength test according to an embodiment of the present disclosure.

DESCRIPTION OF EMBODIMENTS

Figure 1:
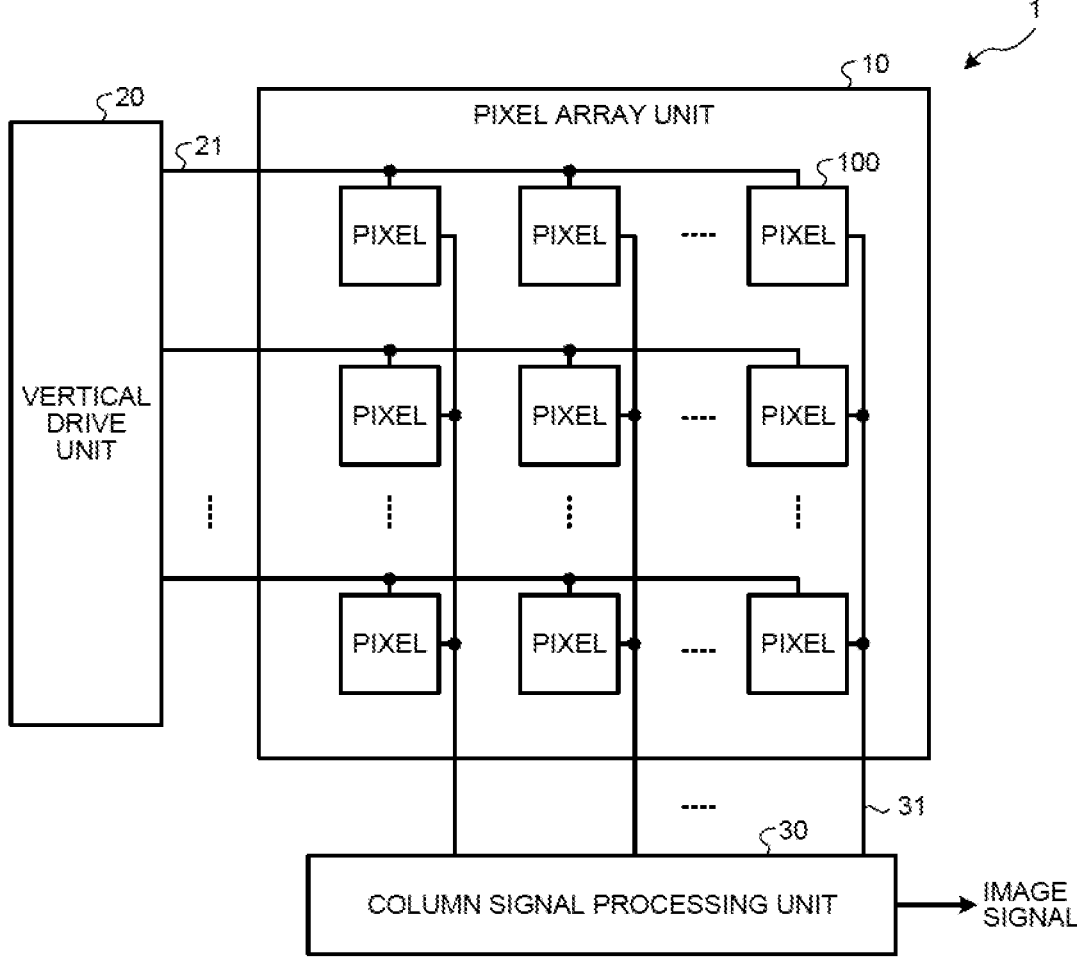
FIG. 1 is a view illustrating a configuration example of an imaging element according to an embodiment of the present disclosure.

Hereinafter, embodiments of the present disclosure will be described in detail with reference to the drawings. The description will be given in the following order. Note that, in each of the following embodiments, the same parts are denoted by the same reference numerals, and redundant description will be omitted.

1. First Embodiment
2. Second Embodiment
3. Third Embodiment
4. Fourth Embodiment
5. Configuration of imaging device

1. First Embodiment

[Configuration of Imaging Element]

FIG. 1 is a view illustrating a configuration example of an imaging element according to an embodiment of the present disclosure. The drawing is a block diagram illustrating a configuration example of an imaging element 1. A semiconductor element according to an embodiment of the present disclosure will be described by taking the imaging element 1 as an example. The imaging element 1 is a semiconductor element that generates image data of a subject. The imaging element 1 includes a pixel array unit 10, a vertical drive unit 20, and a column signal processing unit 30.

The pixel array unit 10 is configured by disposing a plurality of pixels 100. The pixel array unit 10 in the drawing illustrates an example in which a plurality of pixels 100 is disposed in a shape of a two-dimensional matrix. Here, the pixel 100 includes a photoelectric conversion unit that performs photoelectric conversion of incident light, and generates an image signal of a subject based on the emitted incident light. For example, a photodiode can be used as the photoelectric conversion unit. Signal lines 21 and 31 are wired to each pixel 100. The pixel 100 is controlled by a control signal transmitted by the signal line 21 to generate an image signal, and outputs the generated image signal via the signal line 31. Note that the signal line 21 is disposed for each row of the shape of the two-dimensional matrix, and is commonly wired to the plurality of pixels 100 disposed in one row. The signal line 31 is disposed for each column of the shape of the two-dimensional matrix, and is commonly wired to the plurality of pixels 100 disposed in one column.

The vertical drive unit 20 generates a control signal of the pixel 100 described above. The vertical drive unit 20 in the drawing can generate a control signal for each row of the two-dimensional matrix of the pixel array unit 10 and output the control signal via the signal line 21.

The column signal processing unit 30 processes the image signal generated by the pixel 100. The column signal processing unit 30 in the drawing simultaneously processes the image signals from the plurality of pixels 100 disposed in one row of the pixel array unit 10. As this processing, for example, analog-digital conversion for converting an analog image signal generated by the pixel 100 into a digital image signal and correlated double sampling (CDS) for removing an offset error of the image signal can be performed. The processed image signal is output to a circuit and the like outside the imaging element 1. Note that the imaging element 1 in the drawing is an example of a semiconductor element described in the claims.

[Plan Configuration of Imaging Element]

Figure 2:
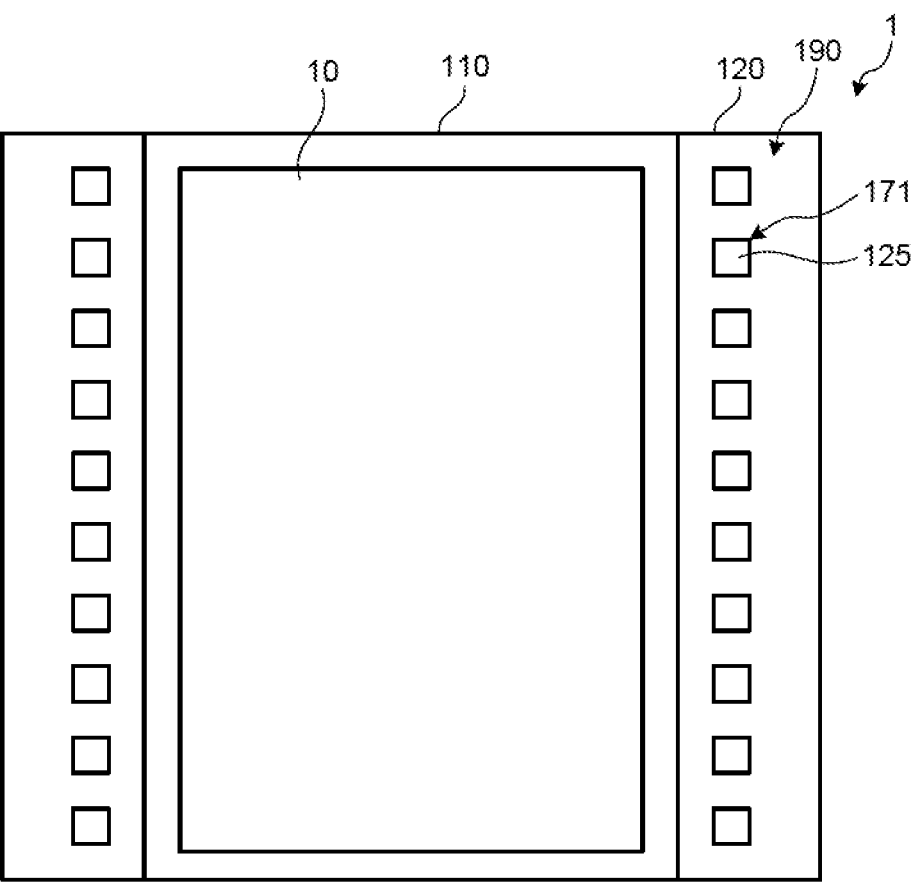
FIG. 2 is a plan view illustrating a configuration example of the imaging element according to the embodiment of the present disclosure.

FIG. 2 is a plan view illustrating a configuration example of the imaging element according to the embodiment of the present disclosure. The drawing is a plan view illustrating a configuration example of the imaging element 1, and is a view illustrating a configuration example of the back surface side of the imaging element 1. The imaging element 1 includes a semiconductor substrate 110 and a wiring region 120. The wiring region 120 is disposed on the front surface side of the semiconductor substrate 110. Note that the back surface side of the imaging element 1 in the drawing corresponds to the back surface side of the semiconductor substrate 110. The pixel array unit 10 described in FIG. 1 is formed in a central portion on the back surface side of the semiconductor substrate 110. The semiconductor substrate 110 near the left and right end portions in the drawing is removed, and a region where the wiring region 120 is exposed is formed. This region is referred to as a semiconductor substrate removal region 190. The semiconductor substrate removal region 190 in the drawing is an example formed along the left and right side surfaces of the imaging element 1.

A bond pad 125 is disposed in the semiconductor substrate removal region 190. The bond pad 125 is an electrode to which a bonding wire is bonded by wire bonding. As described later, the bond pad 125 is embedded in the wiring region 120, and is exposed to the side of the semiconductor substrate removal region 190 by an opening portion 171 formed in the wiring region 120.

[Cross Section Configuration of Imaging Element]

Figure 3:
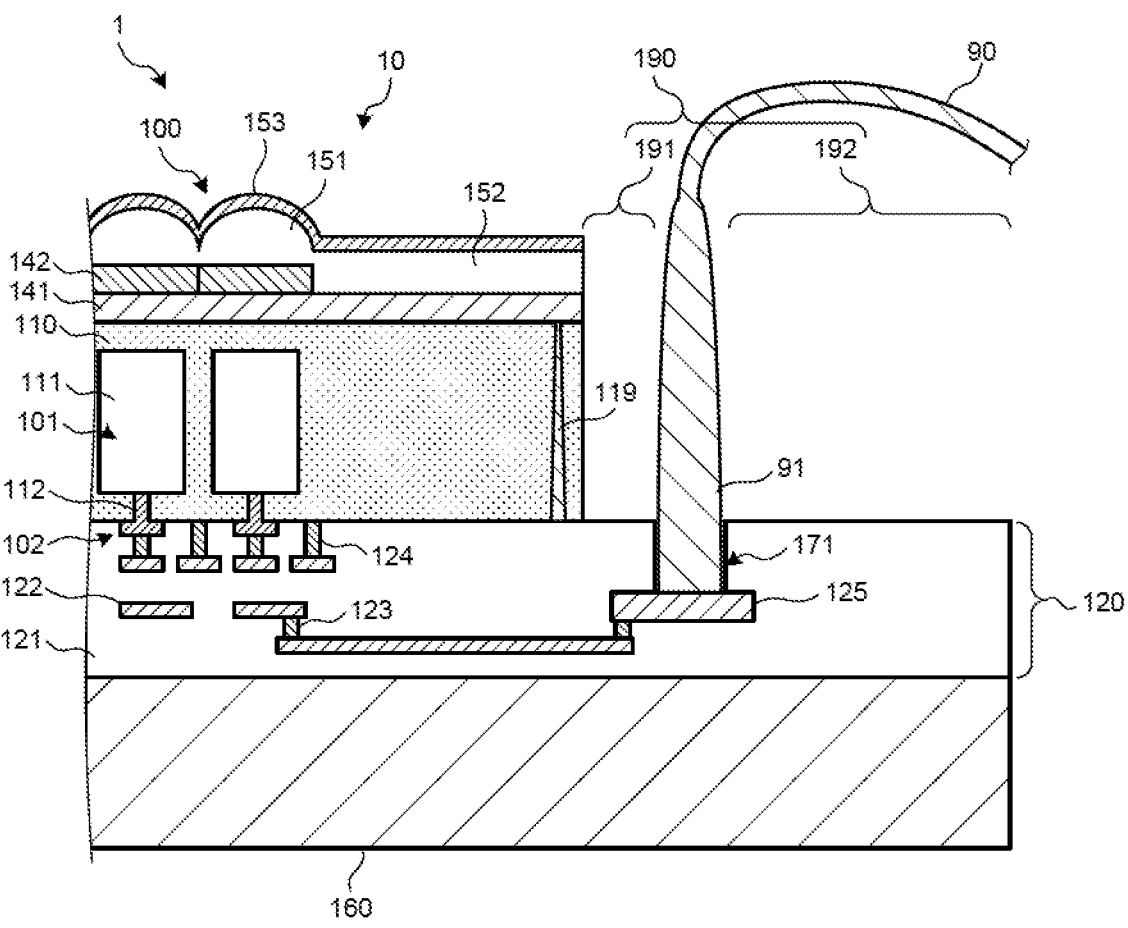
FIG. 3 is a cross-sectional view illustrating a configuration example of an imaging element according to a first embodiment of the present disclosure.

FIG. 3 is a cross-sectional view illustrating a configuration example of an imaging element according to a first embodiment of the present disclosure. The drawing is a cross-sectional view illustrating a configuration example of the imaging element 1. The imaging element 1 in the drawing includes the semiconductor substrate 110, the wiring region 120, insulating films 141 and 153, a color filter 142, an on-chip lens 151, and a support substrate 160. Note that a bonding wire 90 is illustrated in the drawing.

The semiconductor substrate 110 is a substrate on which a semiconductor element is formed. Specifically, a diffusion region of the semiconductor element is formed in the semiconductor substrate 110. The semiconductor substrate 110 can be made of, for example, silicon (Si). The semiconductor element is disposed in a well region formed in the semiconductor substrate 110. For convenience, the semiconductor substrate 110 in the drawing is assumed to be configured in a p-type well region. By forming an n-type or p-type semiconductor region in the p-type well region, a semiconductor element can be formed.

In the drawing, a photoelectric conversion unit 101 and a charge transfer unit 102 are illustrated as an example. The photoelectric conversion unit 101 is an element that is disposed for each pixel 100 described in FIG. 1 and performs photoelectric conversion of incident light. The photoelectric conversion unit 101 includes an n-type semiconductor region 111 (colored background rectangular region) disposed on the semiconductor substrate 110 in the drawing. Specifically, a photodiode constituted by a pn joining at an interface between the n-type semiconductor region 111 and a surrounding p-type well region corresponds to the photoelectric conversion unit 101.

The charge transfer unit 102 is an element that transfers the charge generated by the photoelectric conversion unit 101. The charge transfer unit 102 includes a MOS transistor including a gate 112. The gate 112 is formed in a shape in which a columnar embedded gate having a depth reaching the n-type semiconductor region 111 from the surface of the semiconductor substrate 110 is joined to a gate electrode disposed on the front surface side of the semiconductor substrate 110. The charge transfer unit 102 is a vertical MOS transistor that transfers the charge generated by the photoelectric conversion unit 101 in the thickness direction of the semiconductor substrate 110. The charge transferred by the charge transfer unit 102 is transferred to a floating diffusion region (not illustrated) disposed near the surface of the semiconductor substrate 110. After that, an image signal is generated by a pixel circuit (not illustrated) based on the transferred charge.

Note that the photoelectric conversion unit 101 and the charge transfer unit 102 are disposed for each pixel 100.

As will be described later, the semiconductor substrate removal region 190 is disposed at the end portion of the imaging element 1. A penetrating insulating portion 119 can be disposed on the semiconductor substrate 110 on the surface adjacent to the semiconductor substrate removal region 190. The penetrating insulating portion 119 is made of an insulator having a shape penetrating the semiconductor substrate 110. By disposing the penetrating insulating portion 119, the side surface of the semiconductor substrate 110 adjacent to the semiconductor substrate removal region 190 can be insulated. The penetrating insulating portion 119 can be formed by embedding an insulator such as $SiO_2$ in a groove formed along the wall surface of the semiconductor substrate 110 and penetrating the semiconductor substrate 110. Note that the penetrating insulating portion 119 can also be disposed on the side surface of the semiconductor substrate 110 other than the surface adjacent to the semiconductor substrate removal region 190.

The wiring region 120 is a region having wiring disposed adjacent to the front surface side of the semiconductor substrate 110 and transmitting a signal of an element. The wiring region 120 includes a wiring 122 and an insulating layer 121. The wiring 122 transmits a signal of the element. The wiring 122 can be made of, for example, a metal such as copper (Cu) or tungsten (W). The insulating layer 121 insulates the wiring 122. The insulating layer 121 can be made of, for example, silicon oxide ($SiO_2$). In addition, the wiring 122 and the insulating layer 121 can be configured in multiple layers. The wirings 122 disposed in different layers can be connected by a via plug 123. In addition, the wiring 122 and the element (semiconductor region) of the semiconductor substrate 110 can be connected by a contact plug 124. The via plug 123 and the contact plug 124 can be made of columnar metal and the like.

In addition, the wiring region 120 further includes the bond pad 125. The bond pad 125 is an electrode to which the bonding wire 90 is bonded. The bond pad 125 can be made of, for example, aluminum (Al). The opening portion 171 is formed in the insulating layer 121 adjacent to the bond pad 125. The bonding wire 90 is bonded via the opening portion 171.

The insulating film 141 is a film that is disposed on the back surface side of the semiconductor substrate 110 and insulates the semiconductor substrate 110. The insulating film 141 can be made of, for example, $SiO_2$.

The color filter 142 is an optical filter that is disposed for each pixel 100 and transmits incident light of a predetermined wavelength among the incident light of the pixel 100. In the color filter 142, a color filter 142 that transmits red light, green light, and blue light can be disposed. In this case, a color filter 142 corresponding to one of red light, green light, and blue light is disposed in the pixel 100.

The on-chip lens 151 is a lens that is disposed for each pixel 100 and condenses incident light on the photoelectric conversion unit 101. The on-chip lens 151 can be made of an organic material such as an acrylic resin or an inorganic material such as silicon nitride (SiN). Note that the members constituting the on-chip lens 151 are disposed to extend in a region outside the pixel array unit 10. This region acts as a protective film 152 that protects the back surface side of the semiconductor substrate 110.

The insulating film 153 is a film that is disposed on the surfaces of the on-chip lens 151 and the protective film 152 to protect the pixel array unit 10. The insulating film 153 can be made of, for example, $SiO_2$.

The support substrate 160 is a substrate that is disposed adjacent to the wiring region 120 and supports the imaging element 1.

The semiconductor substrate 110 at the end portion of the imaging element 1 and the insulating film 141 and protective film 152 disposed on the back surface side of the semiconductor substrate 110 are removed, and the back surface side of the wiring region 120 is exposed. A region from which the semiconductor substrate 110 is removed is referred to as the semiconductor substrate removal region 190. The bond pad 125 and the opening portion 171 are disposed in the wiring region 120 adjacent to the semiconductor substrate removal region 190, and wire bonding is performed from the back surface side of the semiconductor substrate 110 via the opening portion 171.

The bonding wire 90 can be made of, for example, a metal wire such as gold (Au). The wire bonding can be performed by the following procedure. First, the bonding wire 90 is passed through an instrument called a capillary, and the tip portion of the bonding wire 90 is made spherical by discharge heating. Next, the tip portion of the bonding wire 90 is heated and pressed against the bond pad 125 using the capillary. As a result, the tip portion of the bonding wire 90 is adhered (welded) to the bond pad 125. At this time, the spherical tip portion of the bonding wire 90 forms a bonding portion 91. The other end portion of the bonding wire 90 is bonded to a pad disposed in an external circuit, and can be electrically connected by wire bonding. Note that the bonding wire 90 is an example of a connection portion described in the claims.

The semiconductor substrate removal region 190 is a region for performing wire bonding and is a region for measuring bonding strength between the bonding wire 90 and the bond pad 125. This bonding strength can be measured by breaking the bonding portion 91 from the surface of the bond pad 125. That is, the bonding strength of the bonding wire 90 can be measured by measuring a load required for breaking the bonding portion 91. Such a test for measuring bonding strength is referred to as a shear strength test. As illustrated in the drawing, the semiconductor substrate removal region 190 is a region including regions 191 and 192. The region 191 is a region between the bonding portion 91 and the semiconductor substrate 110. The region 192 is a region on the opposite side of the region 191 based on the bonding portion 91.

Note that the configuration of the imaging element 1 is not limited to this example. For example, the penetrating insulating portion 119 can be omitted. In addition, the insulating film 153 can be omitted.

[Shear Strength Test]

Figure 4:
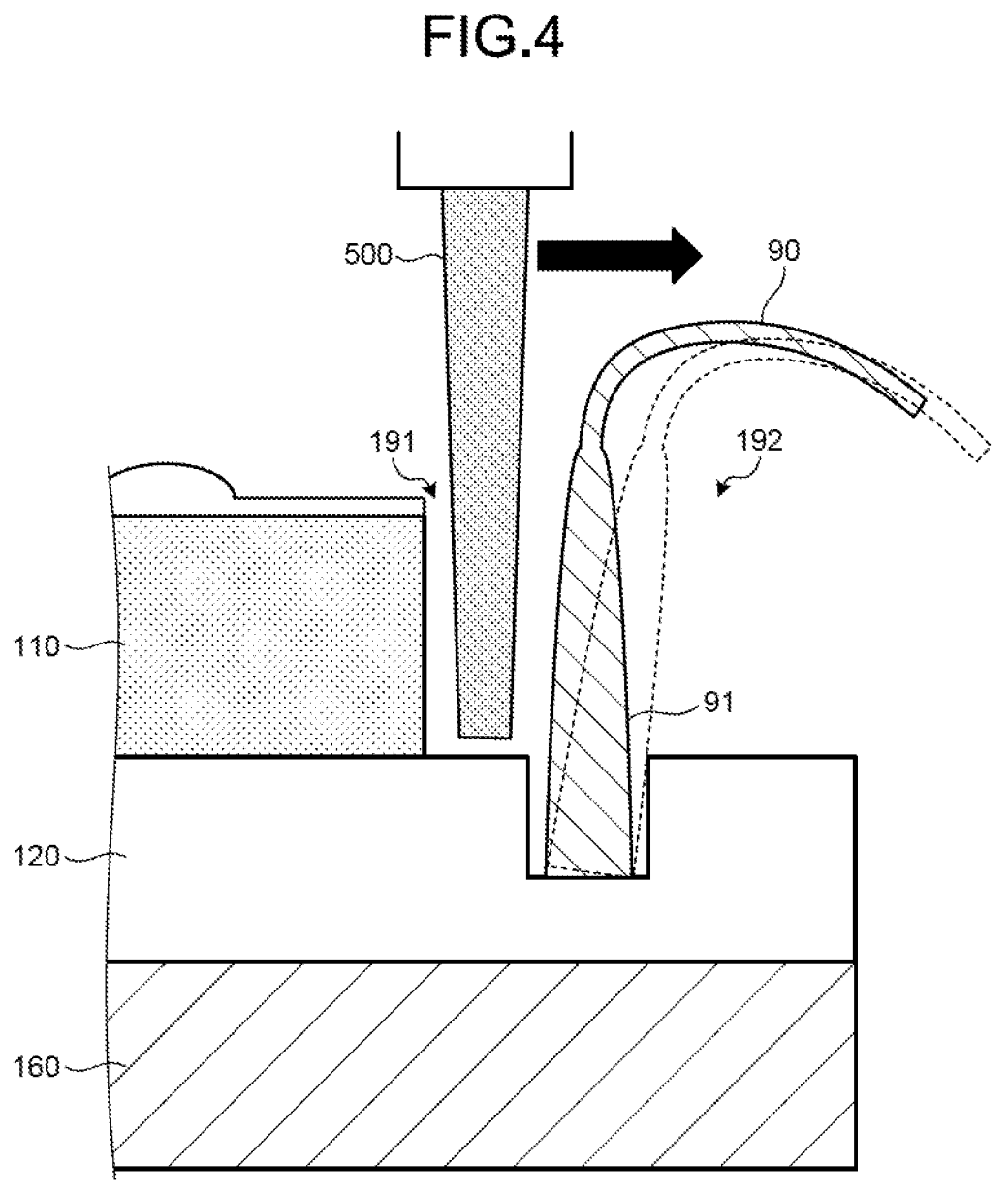

FIG. 4 is a view illustrating an example of a shear strength test according to an embodiment of the present disclosure. The drawing illustrates an example in which the bonding strength of the bonding wire 90 is measured by a shear strength test. For convenience, the imaging element 1 in the drawing has been simplified. The shear strength test can be performed by the following procedure. First, a test instrument 500 is disposed beside the bonding portion 91, that is, in the region 191. Next, the test instrument 500 is moved in the direction of the arrow to abut on the bonding portion 91, and the bonding portion 91 is pushed and sheared. By measuring the load at the time of shearing, the bonding strength can be measured. A dotted line in the drawing represents the broken bonding portion 91. As described above, the region 191 is a region where the test instrument 500 that pushes and shears the bonding wire 90 for measuring the bonding strength is disposed, and the region 192 is a region where the pushed bonding portion 91 moves. Since the imaging element 1 of the present disclosure has the semiconductor substrate removal region 190 including the regions 191 and 192, the bonding strength of the bonding wire 90 can be accurately measured.

In the semiconductor element of the prior art, an opening portion having substantially the same shape as the opening portion 171 is also formed in the semiconductor substrate 110, and the bonding wire 90 is bonded. However, in the imaging element 1, it is necessary to increase the size in the thickness direction of the semiconductor substrate 110. This is for performing photoelectric conversion of long-wavelength light such as red light reaching a deep portion of the semiconductor substrate 110. Therefore, the opening portion of the semiconductor substrate becomes deep, and the bonding portion 91 of the bonding wire 90 is hidden by the semiconductor substrate 110. The shear strength test may be hindered. In the semiconductor element of the present disclosure, by disposing the semiconductor substrate removal region 190, a precise shear strength test as described above can be performed.

[Method for Manufacturing Imaging Element]

Figure 5A:
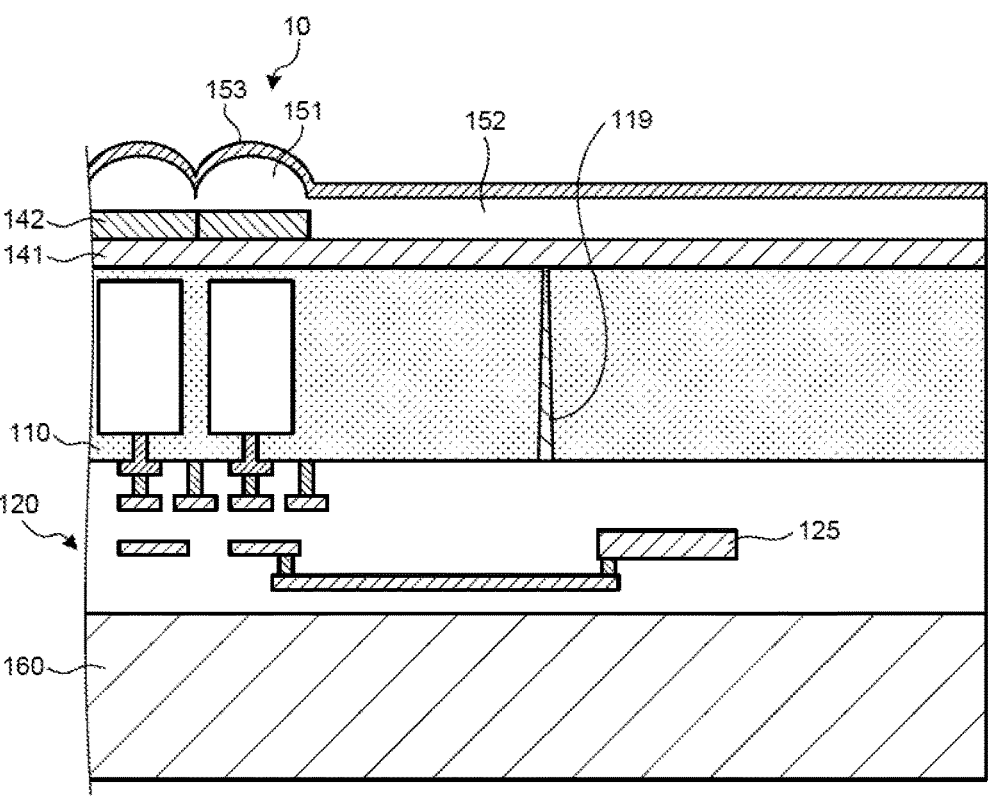
FIG. 5A is a view illustrating an example of a method for manufacturing the imaging element according to the first embodiment of the present disclosure.

FIGS. 5A to 5F are views illustrating an example of a method for manufacturing the imaging element according to the first embodiment of the present disclosure. FIGS. 5A to 5F are views illustrating an example of a manufacturing process of the imaging element 1. First, the well region, the n-type semiconductor region 111, and the like are formed in the semiconductor substrate 110, and the wiring region 120 is formed on the front surface side of the semiconductor substrate 110. Next, the support substrate 160 is bonded to the wiring region 120, and the back surface side of the semiconductor substrate 110 is ground to be thinned. Next, the insulating film 141, the color filter 142, the on-chip lens 151, the protective film 152, and the insulating film 153 are sequentially disposed on the back surface side of the ground semiconductor substrate 110 to form the pixel array unit 10 (FIG. 5A).

Figure 5B:
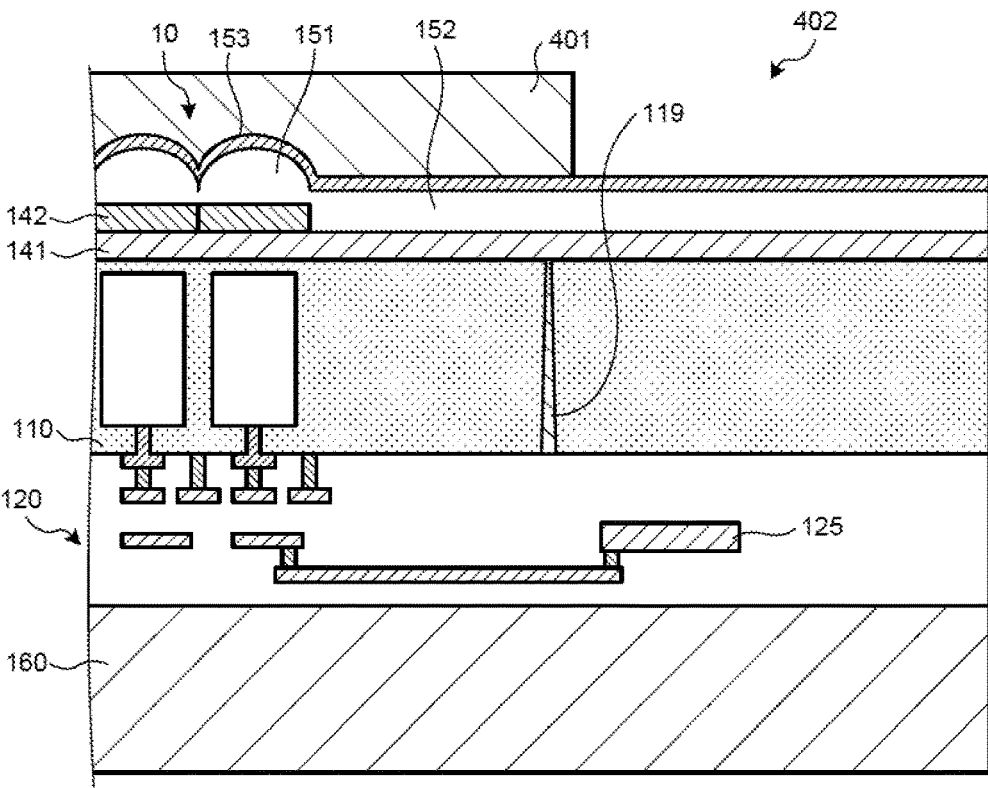
FIG. 5B is a view illustrating an example of the method for manufacturing the imaging element according to the first embodiment of the present disclosure.

Next, a resist 401 is disposed adjacent to the insulating film 153. In the resist 401, an opening portion 402 is formed in a region from which the semiconductor substrate 110 is removed to form the semiconductor substrate removal region 190. The opening portion 402 can be formed by photolithography (FIG. 5B).

Figure 5C:
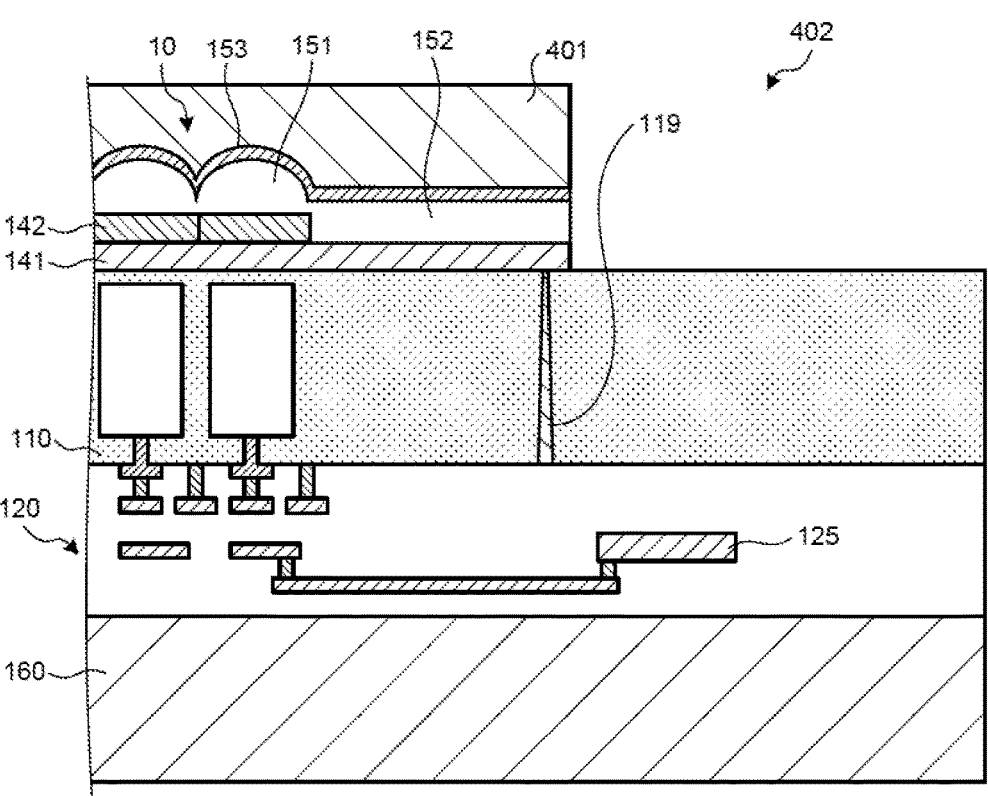
FIG. 5C is a view illustrating an example of the method for manufacturing the imaging element according to the first embodiment of the present disclosure.

Next, the insulating film 153, the protective film 152, and the insulating film 141 adjacent to the opening portion 402 are removed. This can be performed by dry etching (FIG. 5C).

Figure 5D:
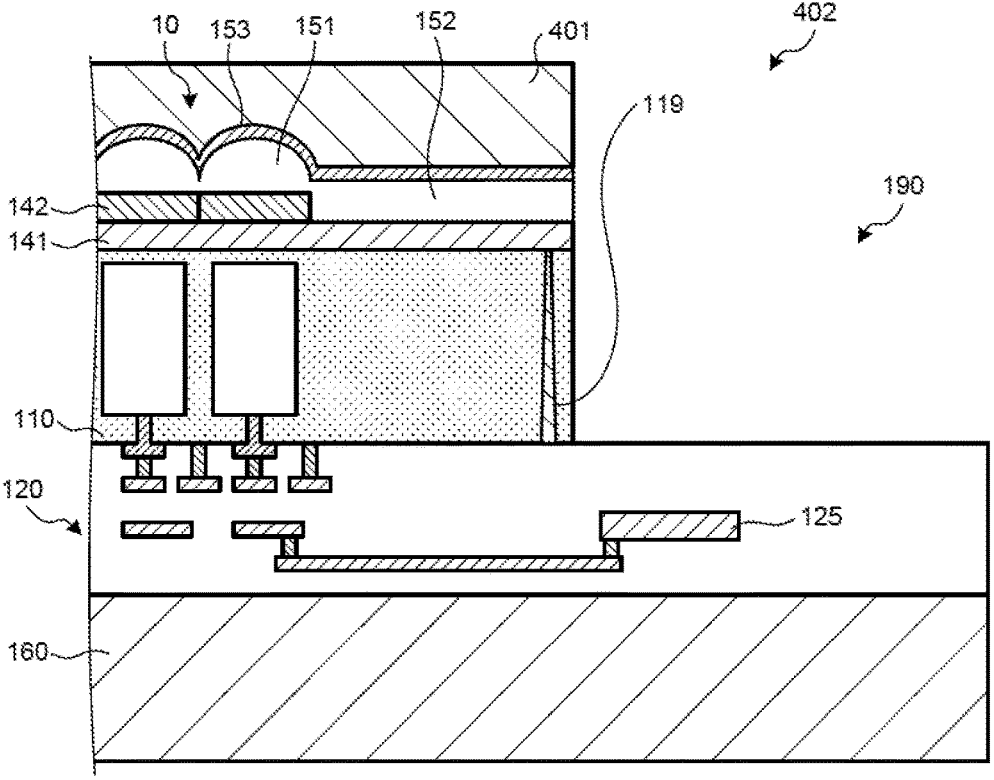
FIG. 5D is a view illustrating an example of the method for manufacturing the imaging element according to the first embodiment of the present disclosure.

Next, the end portion of the semiconductor substrate 110 is removed to form the semiconductor substrate removal region 190. This can be performed by etching the end portion of the semiconductor substrate 110 using the resist 401. Dry etching can also be applied to this etching. At this time, dry etching is performed based on an etching condition different from that in FIG. 5C (FIG. 5D).

Figure 5E:
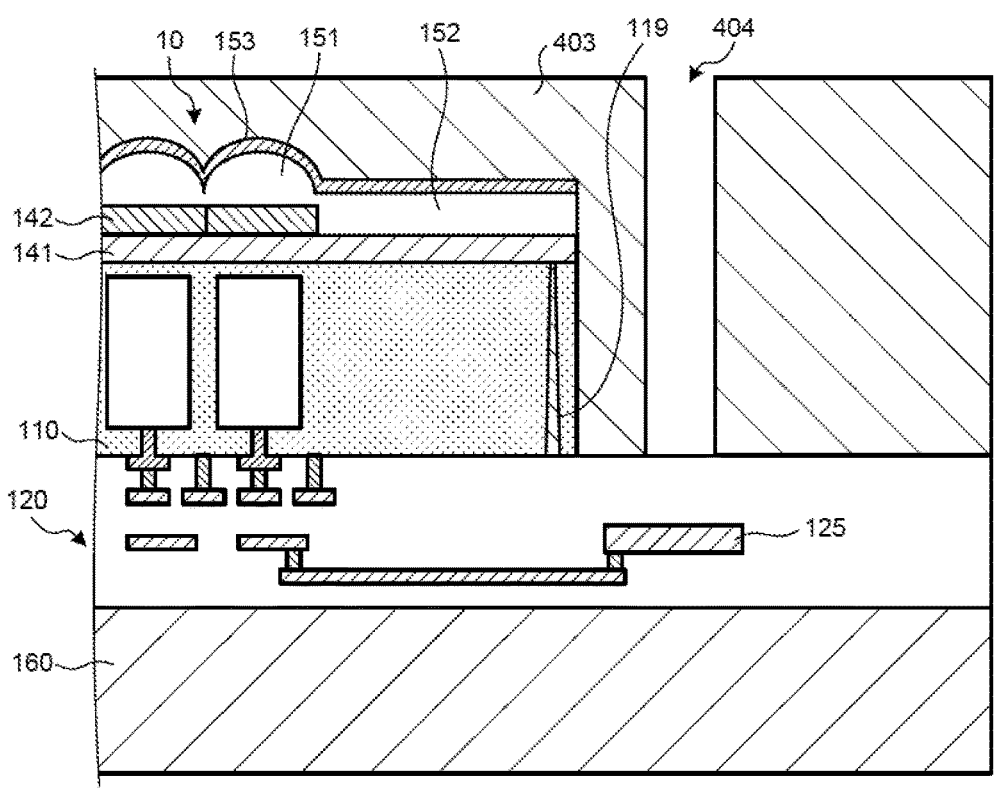
FIG. 5E is a view illustrating an example of the method for manufacturing the imaging element according to the first embodiment of the present disclosure.

Next, the resist 401 is removed, and a resist 403 is disposed. In the resist 403, an opening portion 404 is formed in a region of the wiring region 120 where the opening portion 171 is to be formed (FIG. 5E).

Figure 5F:
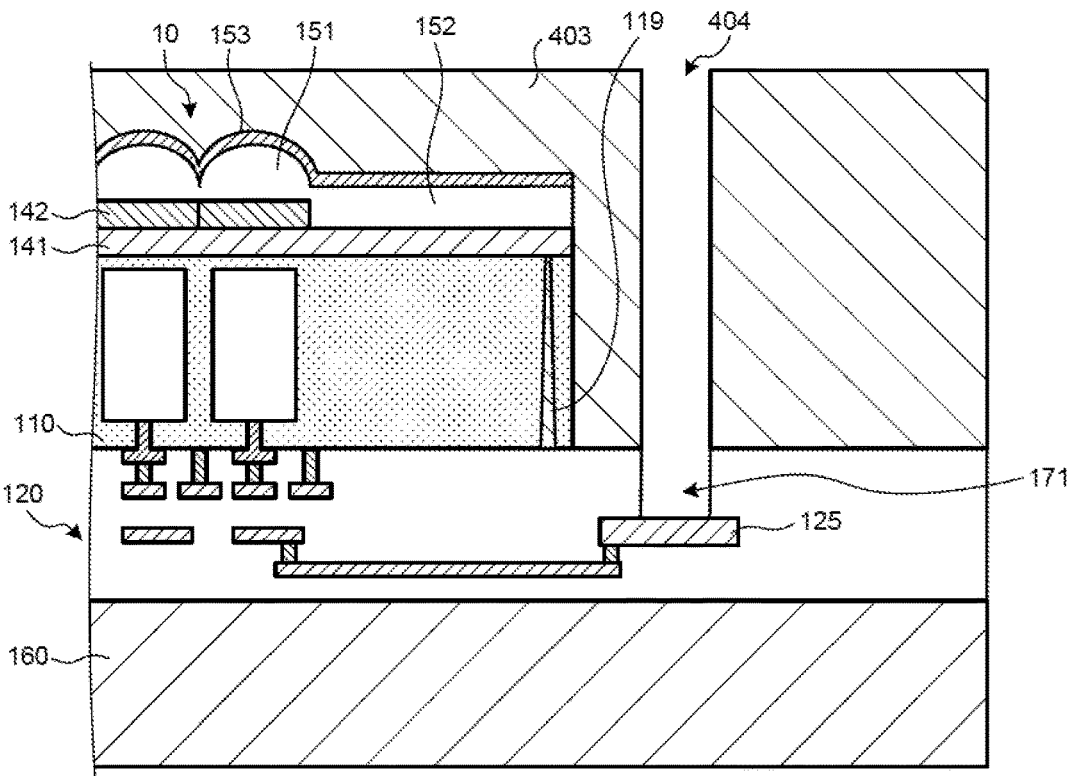
FIG. 5F is a view illustrating an example of the method for manufacturing the imaging element according to the first embodiment of the present disclosure.

Next, the insulating layer 121 of the wiring region 120 is etched using the resist 403 to form the opening portion 171 (FIG. 5F).

Thereafter, the resist 403 is removed, and the wafer on which the imaging element 1 is formed is diced to singulate the imaging element 1. Next, the imaging element 1 singulated by die bonding is bonded onto a substrate such as a semiconductor package. Next, wire bonding is performed to bond the bonding wire 90 to the bond pad 125. The imaging element 1 can be manufactured by the above steps.

[Configuration of Another Imaging Element]

Figure 6A:
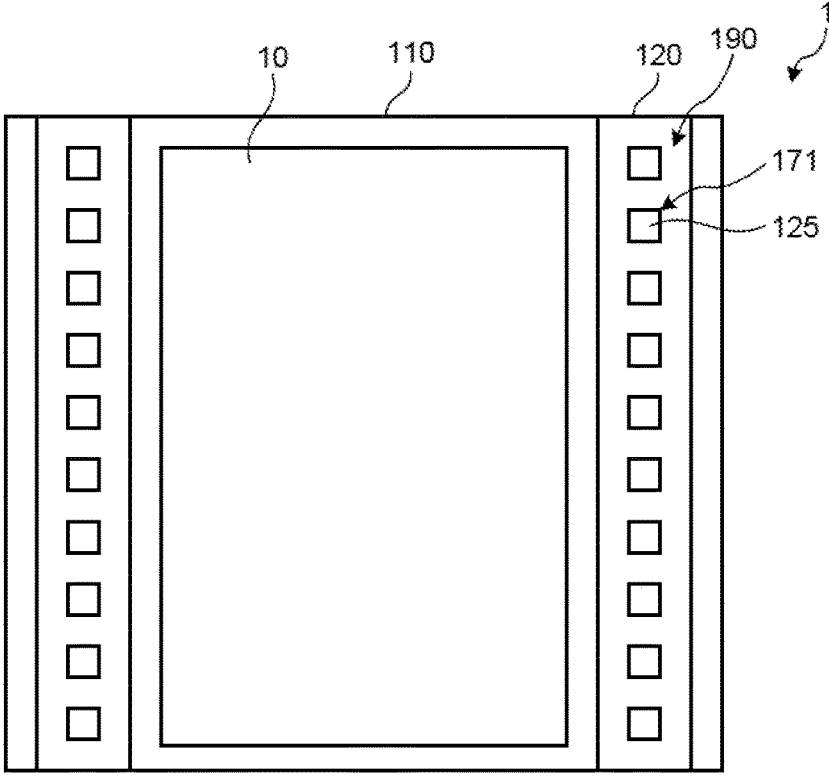
FIG. 6A is a view illustrating another configuration example of the imaging element according to the embodiment of the present disclosure.
Figure 6B:
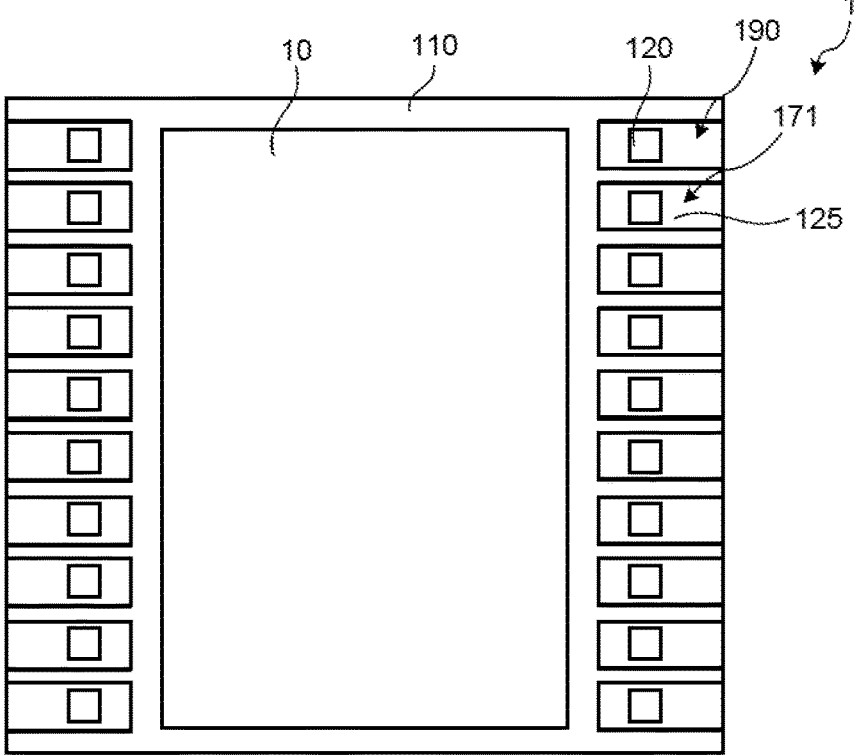
FIG. 6B is a view illustrating another configuration example of the imaging element according to the embodiment of the present disclosure.
Figure 6C:
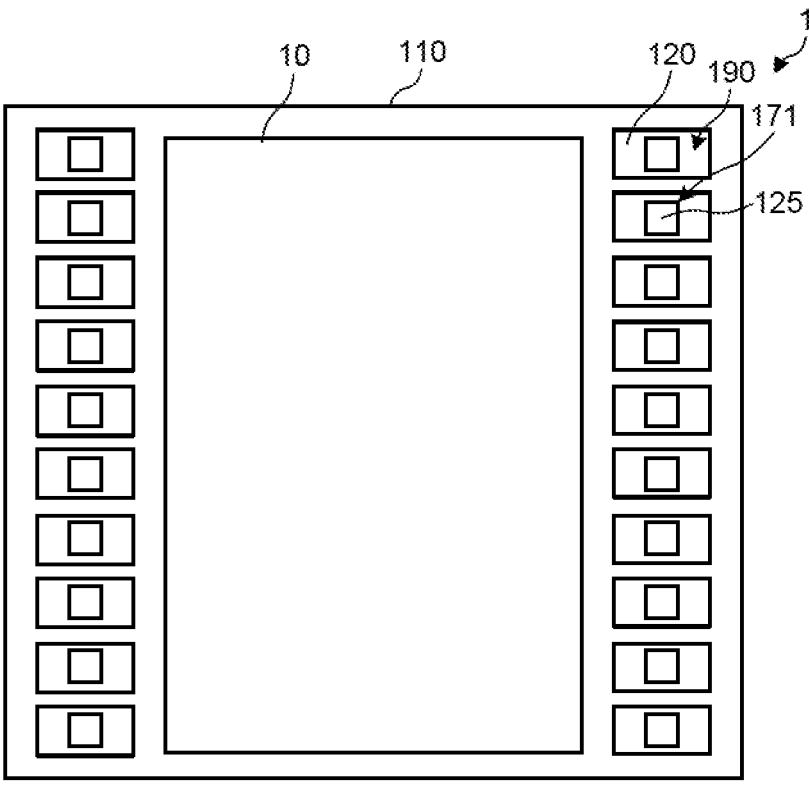
FIG. 6C is a view illustrating another configuration example of the imaging element according to the embodiment of the present disclosure.

FIGS. 6A to 6C are views illustrating another configuration example of the imaging element according to the embodiment of the present disclosure. FIGS. 6A to 6C are plan views illustrating a configuration example of the imaging element 1 similarly to FIG. 2. The imaging element 1 in FIGS. 6A to 6C is different from the imaging element 1 in FIG. 2 in the shape of the semiconductor substrate removal region 190.

The imaging element 1 of FIG. 6A illustrates an example in which the semiconductor substrate removal region 190 is disposed along the arrangement direction of the bond pads 125. When the shear strength test is performed, as illustrated in FIG. 4, the test instrument 500 can be disposed between the bonding portion 91 of the bonding wire 90 and the semiconductor substrate 110. In this case, assuming that the horizontal direction and the vertical direction of the paper surface of the drawing are the x-axis and the y-axis, respectively, the bonding portion 91 is pushed in the direction of the x-axis to measure the bonding strength. In addition, it is also possible to measure shear strength for pushing the bonding portion 91 in the direction of the y-axis by disposing the test instrument 500 on the upper side or the lower side of the bonding portion 91 of the bonding wire 90 in the drawing. In this case, the shear strength test of the plurality of bonding wires 90 can be sequentially performed by moving the test instrument 500 in the direction of the y-axis from the end portion of the imaging element 1. In this case, a region between the bonding wires 90 corresponds to the region for performing the shear strength test included in the semiconductor substrate removal region 190.

The imaging element 1 in FIG. 6B illustrates an example of a case where the semiconductor substrate removal region

190 is disposed for each bond pad 125. The semiconductor substrate removal region 190 is also formed at the end portion of the imaging element 1. The semiconductor substrate removal region 190 having such a shape can be shared with the adjacent imaging element 1 in the wafer-like imaging element 1 before being singulated. That is, the semiconductor substrate removal region 190 in FIG. 6B can be formed by commonly removing the semiconductor substrates 110 at the end portions of the adjacent imaging elements 1 and performing dicing. The semiconductor substrate removal region 190 of the imaging element 1 of FIG. 2 can be similarly formed.

The imaging element 1 in FIG. 6C illustrates an example of the semiconductor substrate removal region 190 disposed for each bond pad 125 and disposed in a region excluding the end portion of the imaging element 1.

As described above, the imaging element 1 according to the first embodiment of the present disclosure can measure the bonding strength of the bonding wire 90 by removing the semiconductor substrate near the bond pad 125.

2. Second Embodiment

In the imaging element 1 of the first embodiment described above, the side surface of the semiconductor substrate 110 adjacent to the semiconductor substrate removal region 190 is insulated by the penetrating insulating portion 119. On the other hand, the imaging element 1 according to a second embodiment of the present disclosure is different from the above first embodiment in that insulation is performed by the insulating film 153.

[Cross Section Configuration of Imaging Element]

Figure 7:
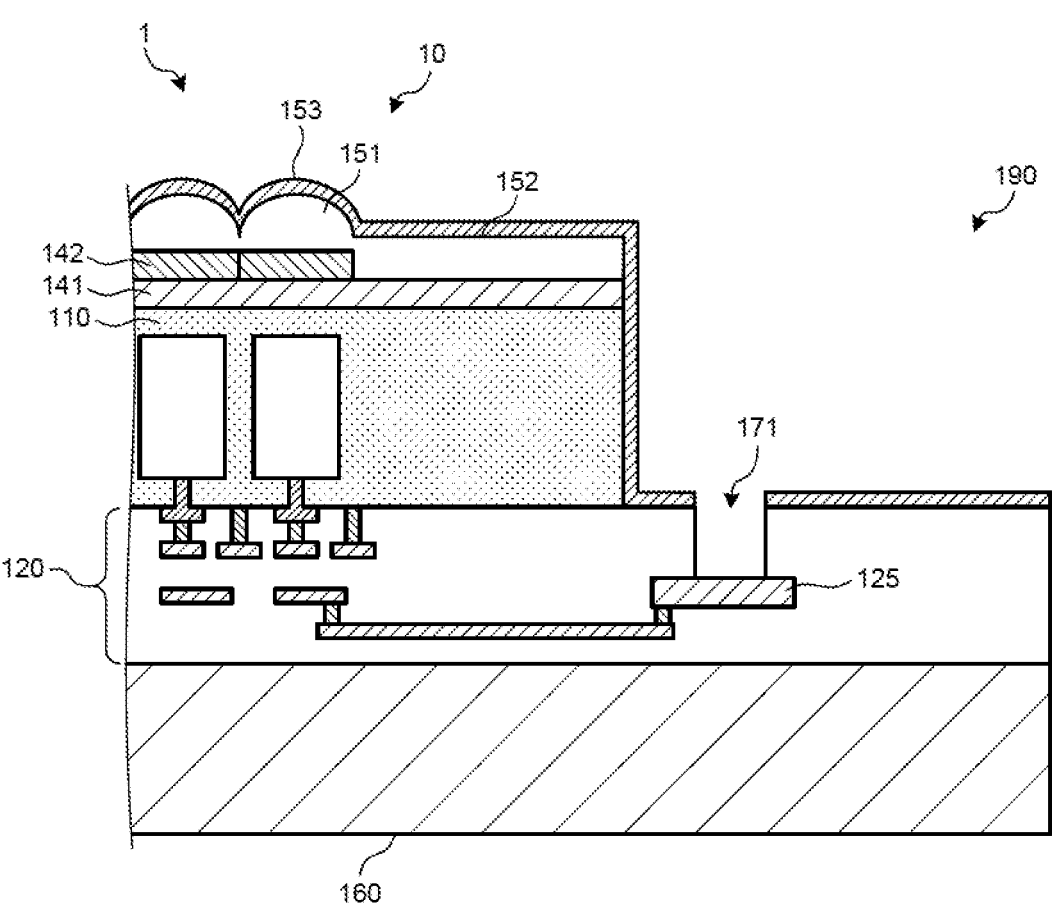
FIG. 7 is a cross-sectional view illustrating a configuration example of an imaging element according to a second embodiment of the present disclosure.

FIG. 7 is a cross-sectional view illustrating a configuration example of an imaging element according to a second embodiment of the present disclosure. The drawing is a cross-sectional view illustrating a configuration example of the imaging element 1, similarly to FIG. 3. The imaging element 1 in the drawing is different from the imaging element 1 in FIG. 3 in that the penetrating insulating portion 119 of the semiconductor substrate 110 is omitted, and the insulating film 153 is disposed on the surfaces of the semiconductor substrate 110 and the wiring region 120 adjacent to the semiconductor substrate removal region 190.

The insulating film 153 in the drawing is formed in a shape extending to the end portion of the imaging element 1 in the semiconductor substrate removal region 190 and is formed in a shape covering the side surface of the semiconductor substrate 110. The side surface of the semiconductor substrate 110 adjacent to the semiconductor substrate removal region 190 can be insulated by the insulating film 153.

[Method for Manufacturing Imaging Element]

FIGS. 8A to 8H are views illustrating an example of a method for manufacturing the imaging element according to the second embodiment of the present disclosure. FIGS. 8A to 8H are views illustrating an example of a manufacturing process of the imaging element 1, similarly to FIGS. 5A to 5F.

Figure 8A:
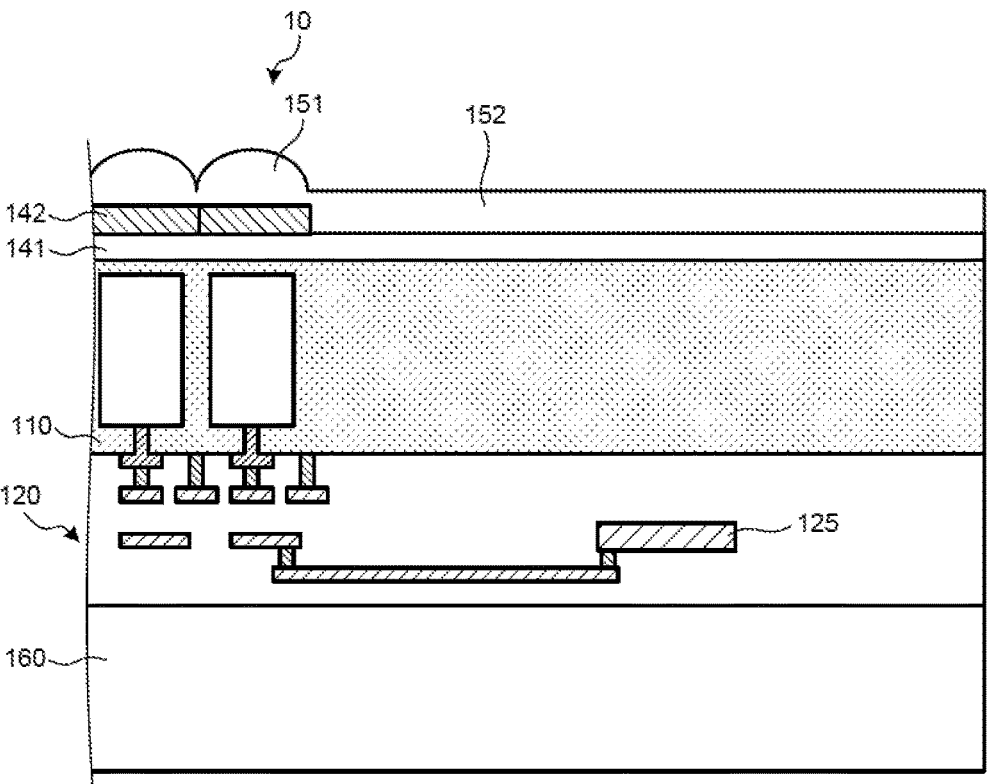
FIG. 8A is a view illustrating an example of a method for manufacturing the imaging element according to the second embodiment of the present disclosure.
Figure 8B:
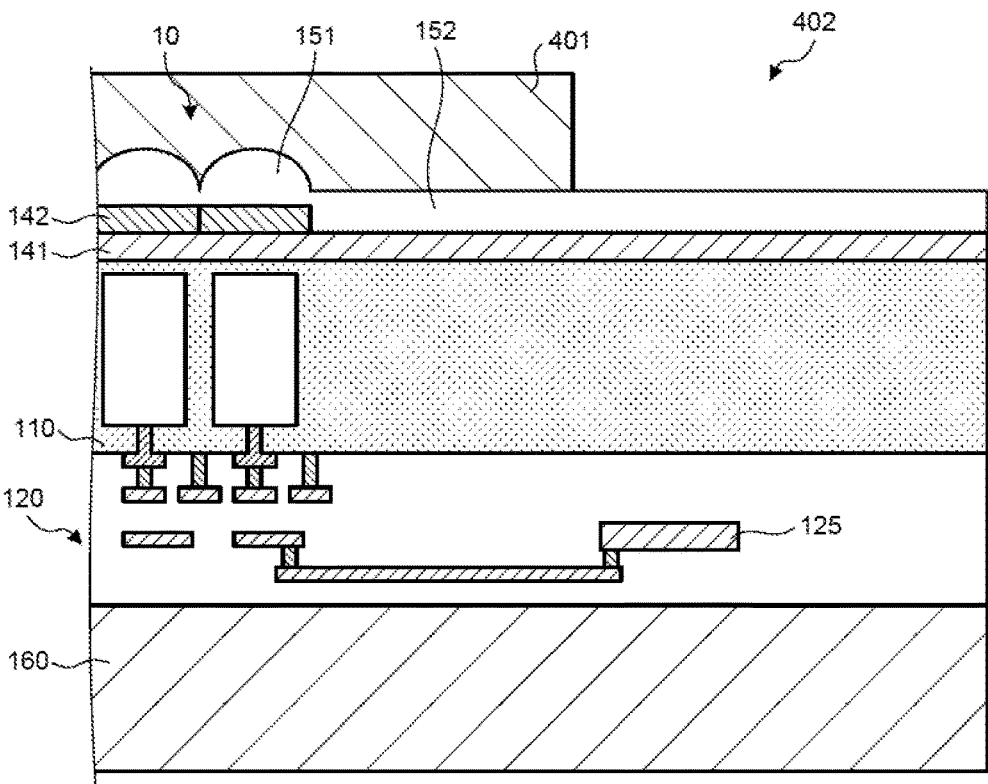
FIG. 8B is a view illustrating an example of the method for manufacturing the imaging element according to the second embodiment of the present disclosure.

The pixel array unit 10 other than the insulating film 153 is formed according to the process described in FIG. 5A (FIG. 8A).

Figure 8C:
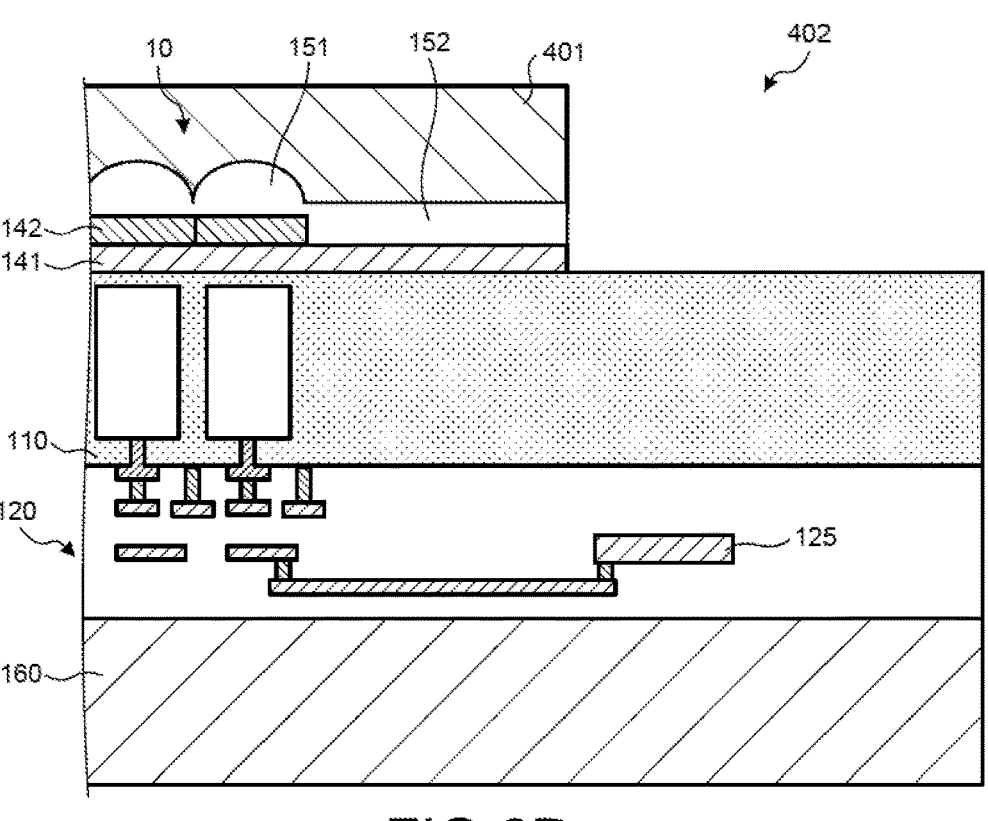
FIG. 8C is a view illustrating an example of the method for manufacturing the imaging element according to the second embodiment of the present disclosure.
Figure 8D:
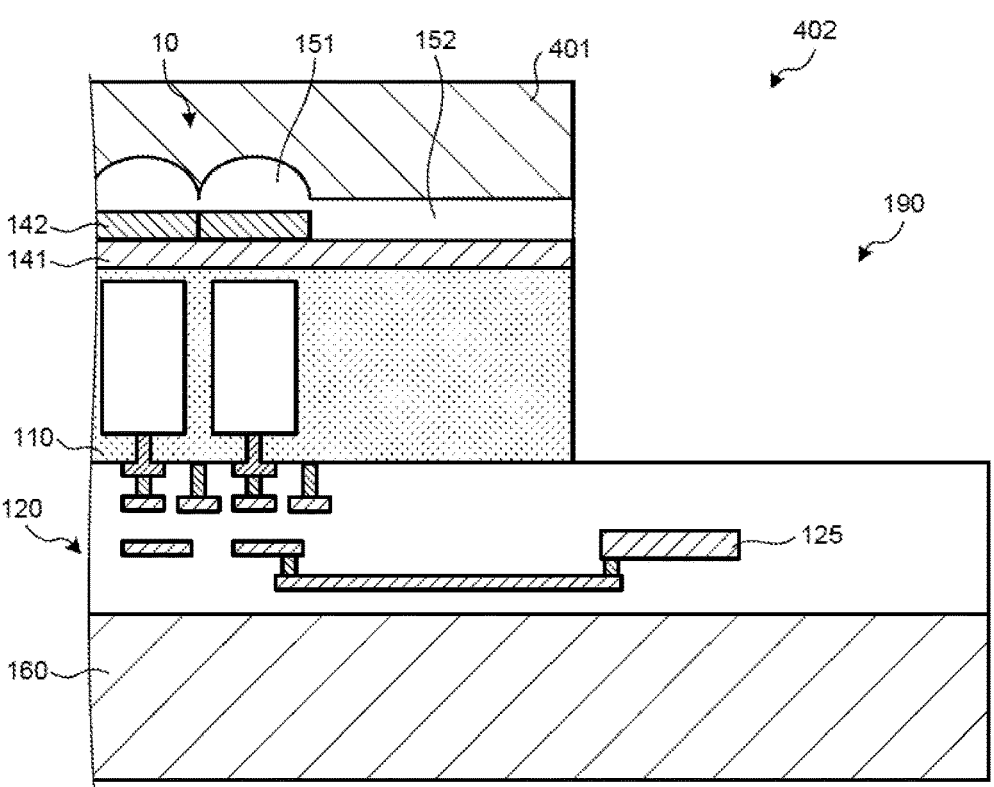
FIG. 8D is a view illustrating an example of the method for manufacturing the imaging element according to the second embodiment of the present disclosure.

Next, the resist 401 having the opening portion 402 is disposed (FIG. 8B), and the protective film 152 and the insulating film 141 are removed by etching (FIG. 8C). Next, the end portion of the semiconductor substrate 110 is removed to form the semiconductor substrate removal region 190 (FIG. 8D). Next, the resist 401 is removed (FIG. 8E).

Figure 8E:
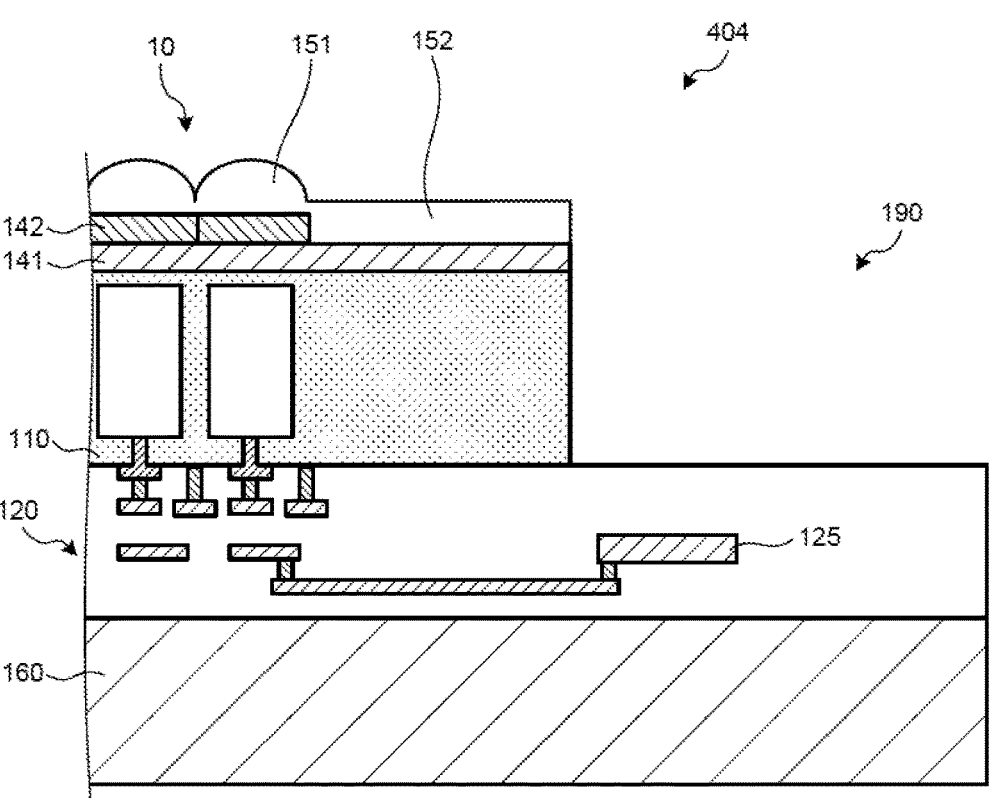
FIG. 8E is a view illustrating an example of the method for manufacturing the imaging element according to the second embodiment of the present disclosure.
Figure 8F:
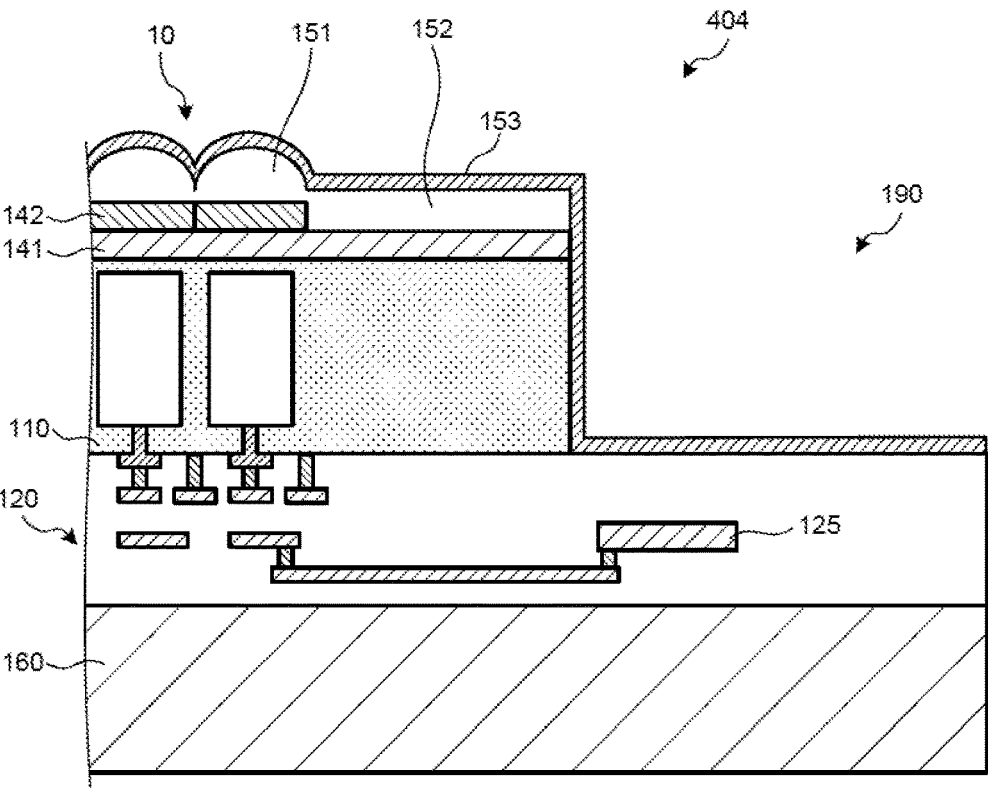
FIG. 8F is a view illustrating an example of the method for manufacturing the imaging element according to the second embodiment of the present disclosure.
Figure 8G:
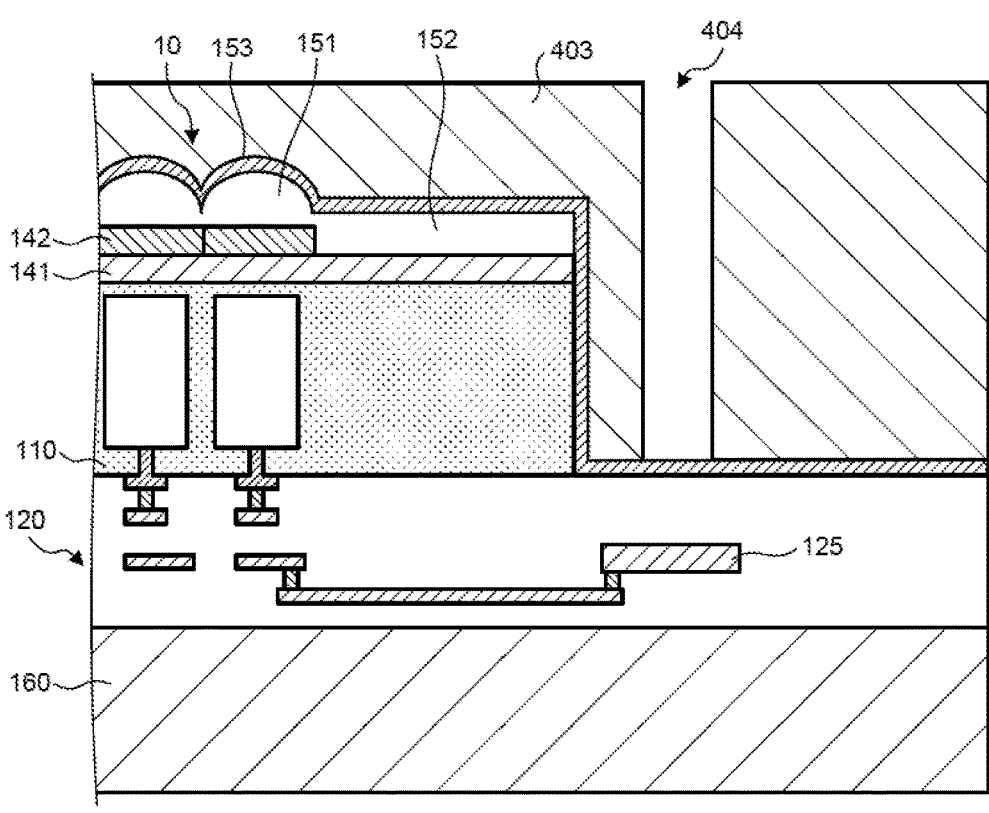
FIG. 8G is a view illustrating an example of the method for manufacturing the imaging element according to the second embodiment of the present disclosure.

Next, an insulator film is disposed on the back surface side of the imaging element 1 to form the insulating film 153 (FIG. 8F). This can be performed by forming a film of SiO₂ and the like using chemical vapor deposition (CVD) and the like.

Figure 8H:
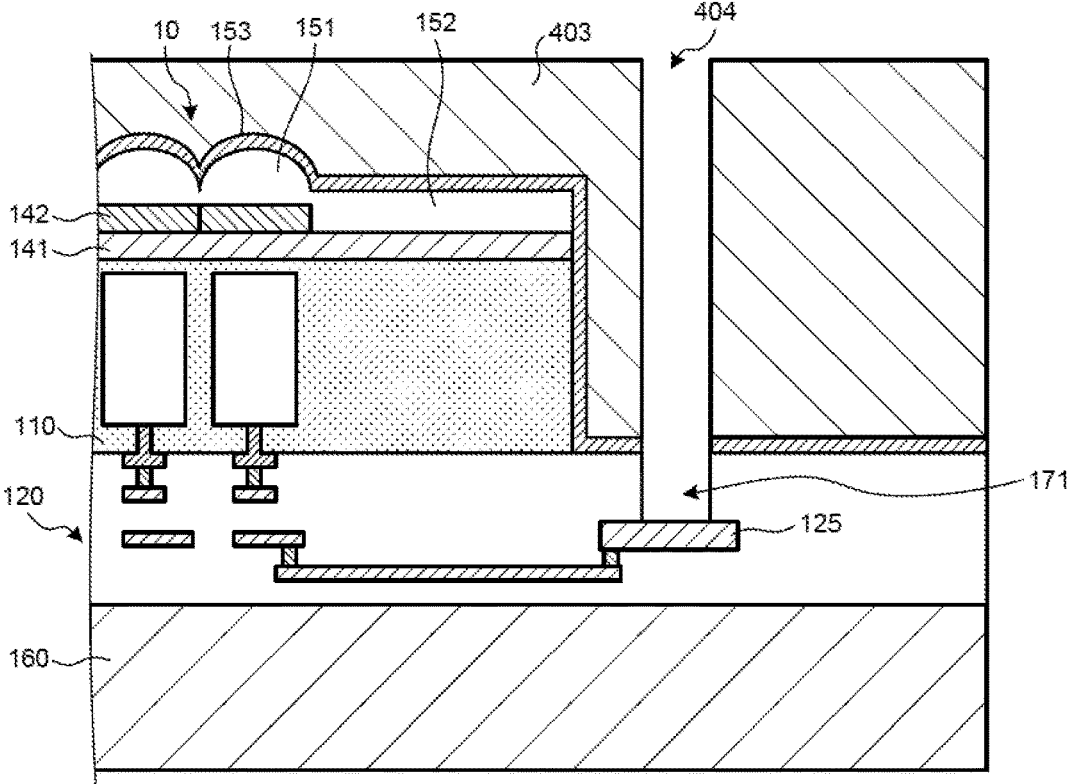
FIG. 8H is a view illustrating an example of the method for manufacturing the imaging element according to the second embodiment of the present disclosure.

Next, the resist 403 having the opening portion 404 is disposed (FIG. 8G), and the insulating layer 121 of the wiring region 120 is etched to form the opening portion 171 (FIG. 8H). After that, the resist 403 is removed. The imaging element 1 can be manufactured by the above steps. Note that the above steps are an example of a method for manufacturing a semiconductor element described in the claims.

Note that the step of FIG. 8E described above may be omitted, and the insulating film described in FIG. 8F may be formed in a state where the resist 401 is disposed. In this case, the insulating film 153 is formed on the side surface of the semiconductor substrate 110 adjacent to the semiconductor substrate removal region 190 and the surface of the wiring region 120.

The configuration of the imaging element 1 other than this is similar to the configuration of the imaging element 1 in the first embodiment of the present disclosure, and thus description is omitted.

As described above, in the imaging element 1 according to the second embodiment of the present disclosure, the side surface of the semiconductor substrate 110 adjacent to the semiconductor substrate removal region 190 is insulated by the insulating film 153. The penetrating insulating portion 119 can be omitted, and the configuration of the imaging element 1 can be simplified.

3. Third Embodiment

In the imaging element 1 of the first embodiment described above, the semiconductor substrate 110 in the region where the wire bonding is performed is removed, and the end portion of the wiring region 120 is exposed. On the other hand, the imaging element 1 according to the third embodiment of the present disclosure is different from the above first embodiment in that a guard ring is disposed in the wiring region 120 at the end portion.

[Cross Section Configuration of Imaging Element]

Figure 9:
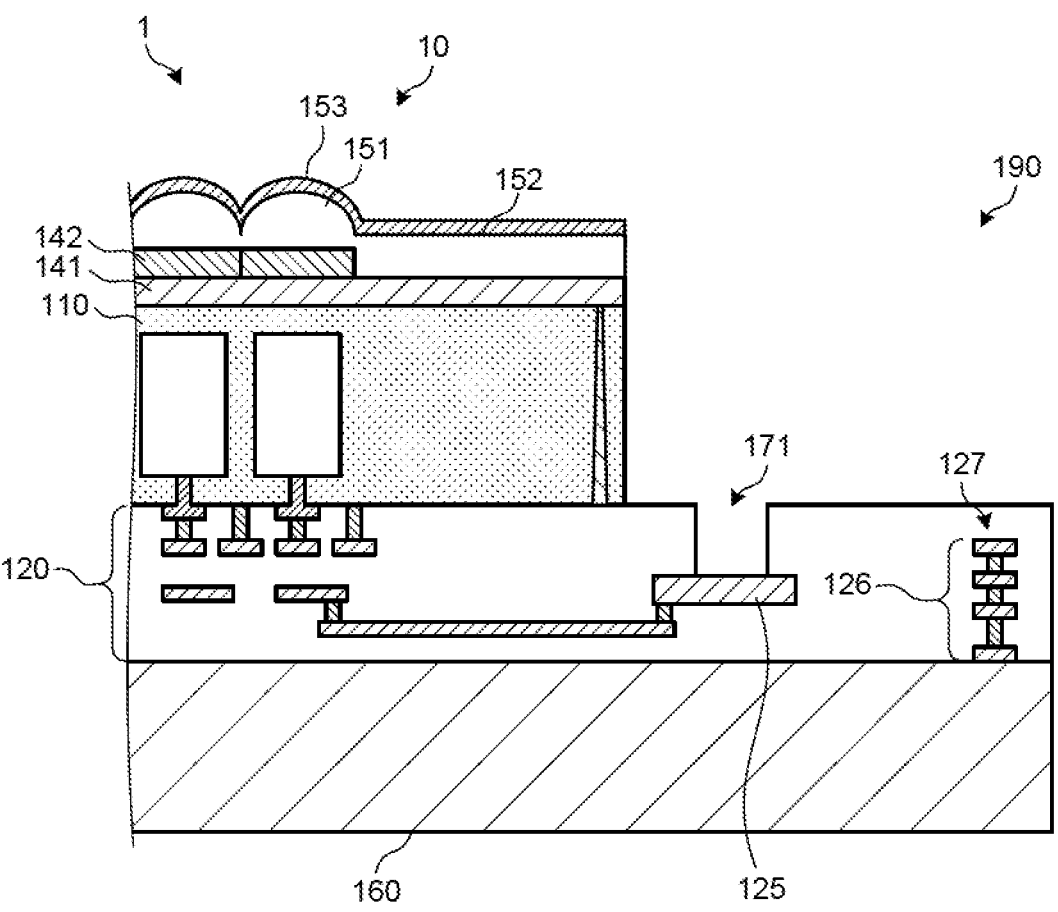
FIG. 9 is a cross-sectional view illustrating a configuration example of an imaging element according to a third embodiment of the present disclosure.

FIG. 9 is a cross-sectional view illustrating a configuration example of an imaging element according to a third embodiment of the present disclosure. The drawing is a cross-sectional view illustrating a configuration example of the imaging element 1, similarly to FIG. 3. The imaging element 1 in the drawing is different from the imaging element 1 in FIG. 3 in that a guard ring 126 is provided at the end portion of the wiring region 120.

The guard ring 126 is disposed near the end portion of the wiring region 120 to protect the wiring region 120. The guard ring 126 can be formed in a ring shape along the outer periphery of the imaging element 1. As described above, the imaging element 1 is singulated by dicing. At the time of this dicing, cracking or chipping may occur in the wiring region 120. The guard ring 126 prevents extension of cracking and the like and prevents damage to the imaging element 1. The guard ring 126 can be made of a metal member. Specifically, the guard ring 126 can include the wiring 122 and the via plug 123 alternately stacked as illustrated in the drawing.

In addition, the wiring 122 and the via plug 123, which are metal members constituting the guard ring 126, can be configured in a shape embedded with respect to the surface of the wiring region 120 adjacent to the semiconductor substrate removal region 190. That is, the wiring 122 and the via plug 123 constituting the guard ring 126 can be formed in a shape that is not exposed on the surface of the wiring region 120 adjacent to the semiconductor substrate removal region 190. In the guard ring 126 in the drawing, the insulating layer 121 is disposed in a region 127 which is a region between the wiring region 120 and a surface adjacent to the semiconductor substrate removal region 190. As described above, the semiconductor substrate removal region 190 is formed by etching the semiconductor substrate 110. In the case of a configuration in which the wiring 122 and the like of the guard ring 126 are exposed to the wiring region 120 in the region where the semiconductor substrate 110 is etched, there is a possibility that etching is performed simultaneously with the semiconductor substrate 110. In this case, the guard ring 126 is damaged. By forming the wiring 122 and the via plug 123 constituting the guard ring 126 in a shape embedded in an insulating layer 221 on the surface of the wiring region 120 adjacent to the semiconductor substrate removal region 190, damage to the guard ring 126 can be prevented. Note that the guard ring 126 is an example of a wiring region protection portion described in the claims.

The configuration of the imaging element 1 other than this is similar to the configuration of the imaging element 1 in the first embodiment of the present disclosure, and thus description is omitted.

As described above, in the imaging element 1 according to the third embodiment of the present disclosure, damage at the time of dicing can be prevented by disposing the guard ring 126 at the end portion of the wiring region 120.

4. Fourth Embodiment

The imaging element 1 of the first embodiment described above uses the semiconductor substrate 110. On the other hand, the imaging element 1 according to the fourth embodiment of the present disclosure is different from the above first embodiment in that a plurality of semiconductor substrates is stacked.

[Cross Section Configuration of Imaging Element]

Figure 10:
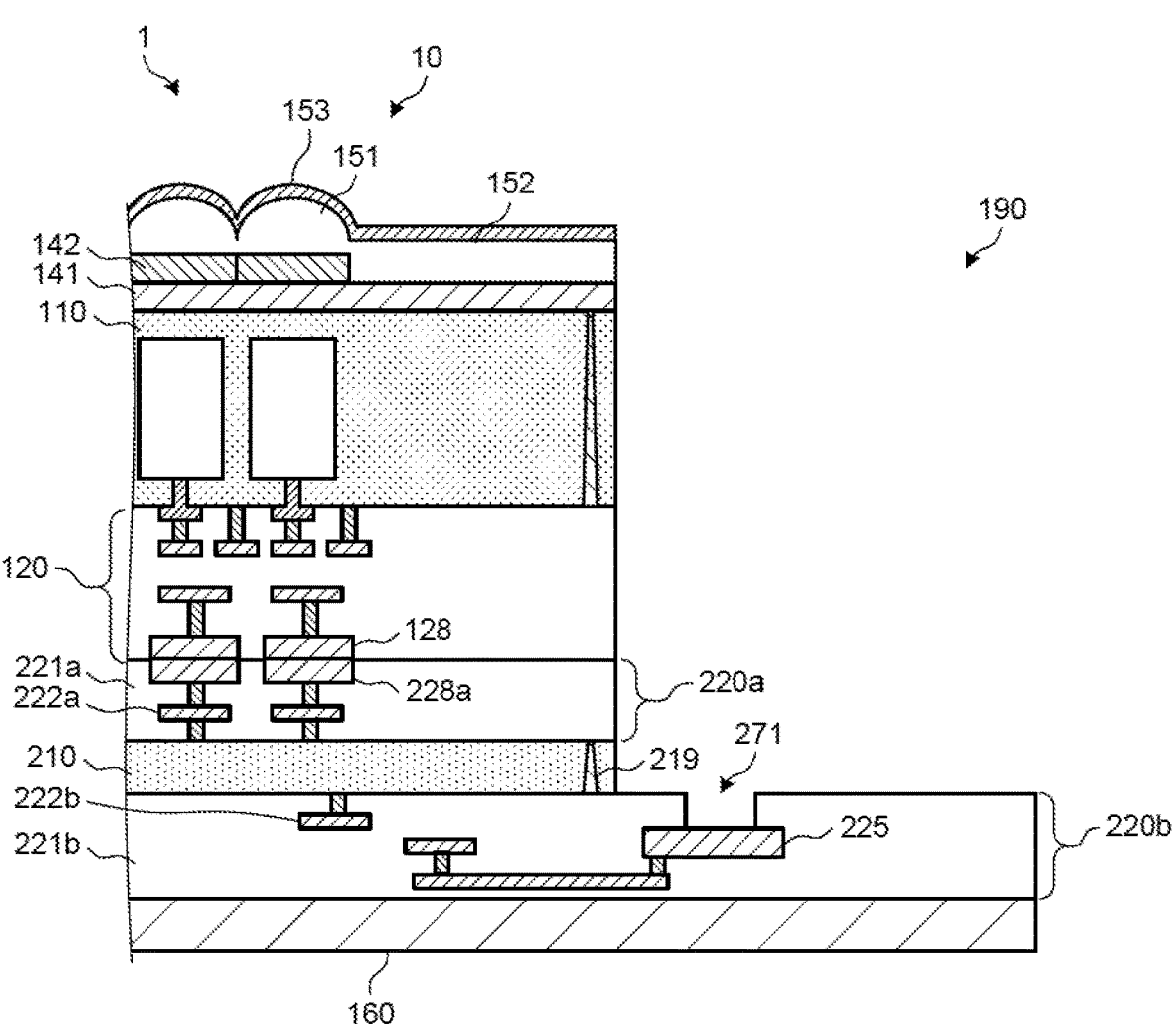
FIG. 10 is a cross-sectional view illustrating a configuration example of an imaging element according to a fourth embodiment of the present disclosure.

FIG. 10 is a cross-sectional view illustrating a configuration example of an imaging element according to a fourth embodiment of the present disclosure. The drawing is a cross-sectional view illustrating a configuration example of the imaging element 1, similarly to FIG. 3. The imaging element 1 in the drawing further includes a semiconductor substrate 210, and is different from the imaging element 1 in FIG. 3 in that a bond pad for wire bonding is disposed in a wiring region of the semiconductor substrate 210.

In the semiconductor substrate 110 in the drawing, the semiconductor substrate 210 and the wiring region are bonded to each other and stacked. In the semiconductor substrate 110 in the drawing, a pad 128 is disposed on the surface of the wiring region 120. The pad 128 is an electrode that is bonded to a pad of the wiring region opposing at the time of bonding and transmits an electric signal. The pad 128 can be made of copper (Cu).

The semiconductor substrate 210 is a semiconductor substrate on which an element is formed similarly to the semiconductor substrate 110. On the semiconductor substrate 210, for example, an element of a pixel circuit that generates an image signal based on a charge generated by the photoelectric conversion unit 101 disposed on the semiconductor substrate 110 and transferred by the charge transfer unit 102 can be disposed. In the semiconductor substrate 210, a penetrating insulating portion 219 having the same configuration as the penetrating insulating portion 119 can be disposed. In addition, wiring regions (a wiring region 220*a* and a wiring region 220*b*) are disposed on both surfaces of the semiconductor substrate 210.

The wiring region 220*a* is a wiring region bonded to the wiring region 120 of the semiconductor substrate 110. The wiring region 220*a* includes a pad 228*a* in addition to a wiring 222*a* and an insulating layer 221*a*. The pad 228*a* is a pad bonded to the pad 128 described above. The bonding of the semiconductor substrates 110 and 210 can be performed by aligning the pads 128 and 228*a*, and then bonding the insulating layer 121 of the wiring region 120 and the insulating layer 221*a* of the wiring region 220*a* by heating and pressing. At this time, the pad 128 and the pad 228*a* are also bonded and electrically connected.

The wiring region 220*b* is a wiring region to which the support substrate 160 is bonded. The wiring region 220*b* includes a wiring 222*b* and an insulating layer 221*b*. In addition, a bond pad 225 is disposed in the wiring region 220*b*. The bond pad 225 is a pad to which the bonding wire 90 is bonded. An opening portion 271 is formed in the insulating layer 221*b* near the bond pad 225. The wire bonding can be performed via the opening portion 271.

The semiconductor substrate removal region 190 in the drawing is a region from which the semiconductor substrate 110 and the semiconductor substrate 210 are removed. Specifically, the semiconductor substrate removal region 190 in the drawing is a region from which the insulating film 153, the protective film 152, the insulating film 141, the semiconductor substrate 110, the wiring region 120, the wiring region 220*a*, and the semiconductor substrate 210 are removed. By disposing the semiconductor substrate removal region 190, wire bonding can be performed, and the bonding strength of the bonding wire 90 can be measured. Note that the semiconductor substrate 210 is an example of a second semiconductor substrate described in the claims.

[Configuration of Another Imaging Element]

Figure 11:
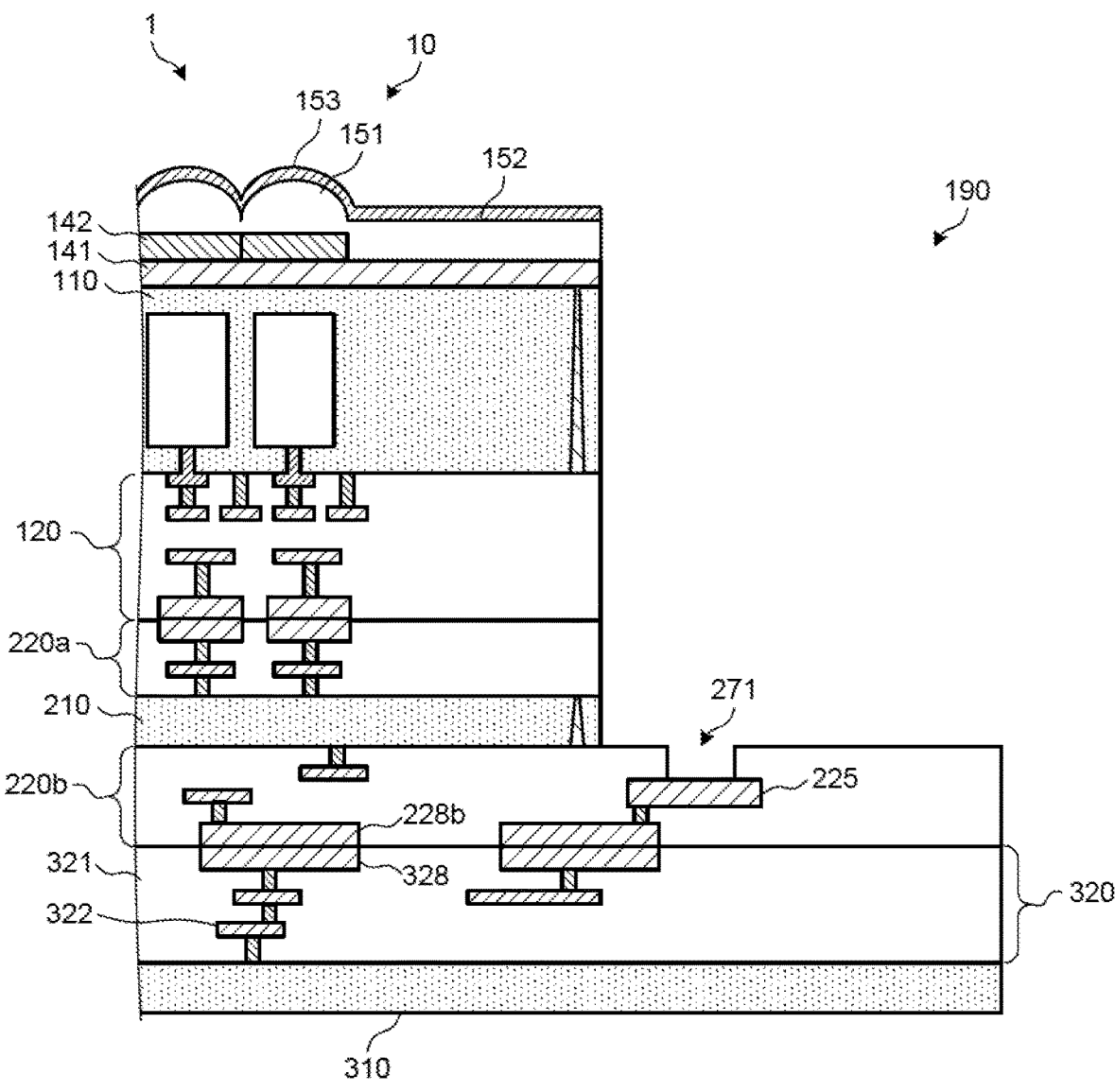
FIG. 11 is a cross-sectional view illustrating another configuration example of the imaging element according to the fourth embodiment of the present disclosure.

FIG. 11 is a cross-sectional view illustrating another configuration example of the imaging element according to the fourth embodiment of the present disclosure. The drawing is a cross-sectional view illustrating a configuration example of the imaging element 1, similarly to FIG. 10. The imaging element 1 in the drawing is different from the imaging element 1 in FIG. 10 in including a semiconductor substrate 310 instead of the support substrate 160.

In the semiconductor substrate 210 in the drawing, the semiconductor substrate 310 and the wiring region are bonded to each other and stacked. In the semiconductor substrate 210 in the drawing, a pad 228*b* is disposed on the surface of the wiring region 220*b*.

The semiconductor substrate 310 is a semiconductor substrate on which an element is formed similarly to the semiconductor substrate 110. For example, elements of the vertical drive unit 20 and the column signal processing unit 30 described in FIG. 1 can be disposed on the semiconductor substrate 310. A wiring region 320 is disposed on the semiconductor substrate 310.

The wiring region 320 includes a wiring 322 and an insulating layer 321. In addition, a pad 328 is disposed in the wiring region 320. The wiring region 320 is a wiring region bonded to the wiring region 220*b* of the semiconductor substrate 210. At the time of bonding, the pad 228*b* and the pad 328 are bonded and electrically connected.

Figure 12:
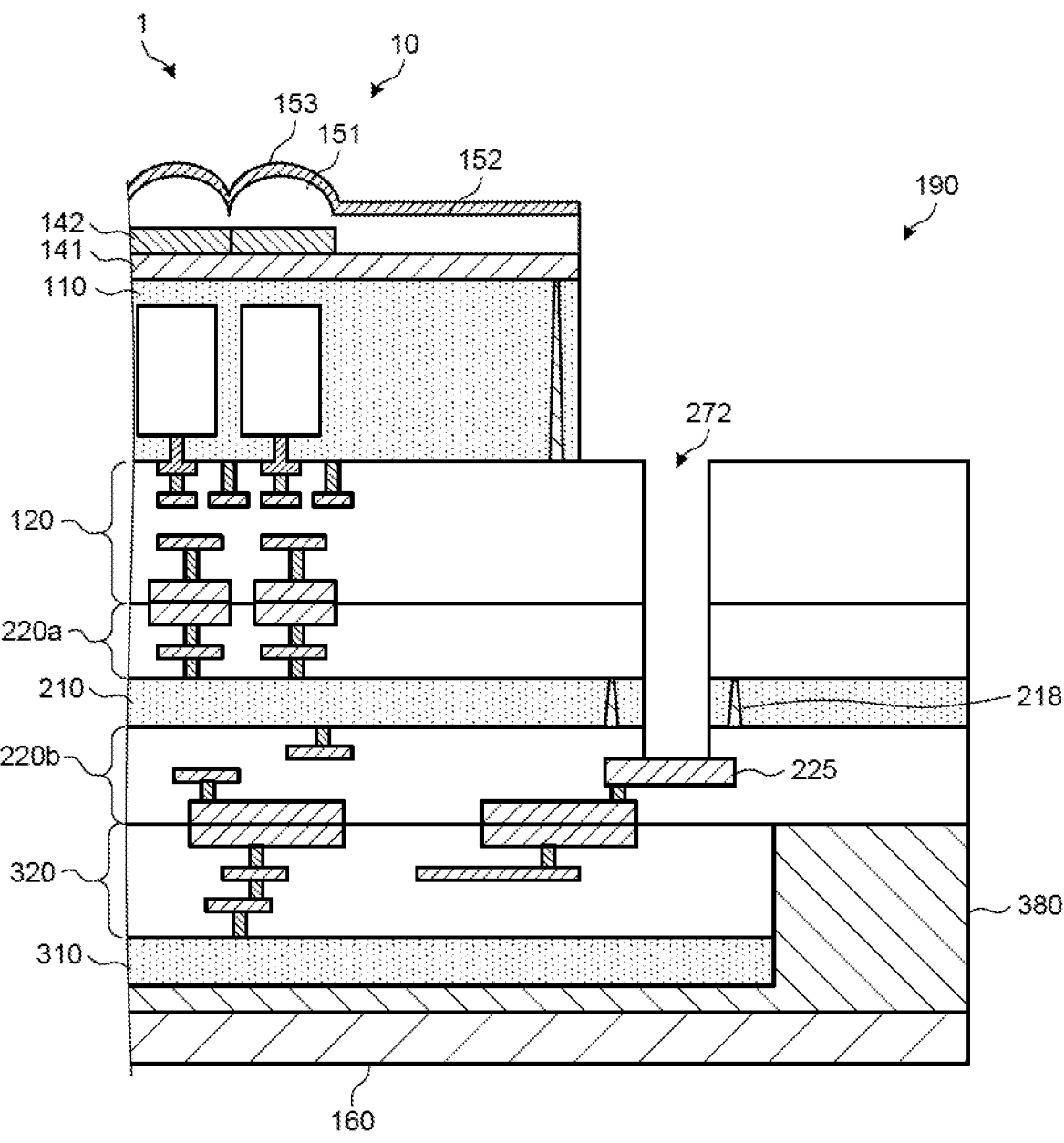
FIG. 12 is a cross-sectional view illustrating another configuration example of the imaging element according to the fourth embodiment of the present disclosure.

FIG. 12 is a cross-sectional view illustrating another configuration example of the imaging element according to the fourth embodiment of the present disclosure. The drawing is a cross-sectional view illustrating a configuration example of the imaging element 1, similarly to FIG. 11. The imaging element 1 in the drawing is different from the imaging element 1 in FIG. 11 in including a semiconductor substrate 310 and a support substrate 160 having a size smaller than that of the semiconductor substrate 210.

The semiconductor substrate 310 in the drawing is a semiconductor substrate having a size smaller than that of the semiconductor substrate 210. The semiconductor substrate 310 is a singulated semiconductor substrate, and is joined to the front surface side of the wafer-like imaging element 1. Such an implementation is referred to as Chip on Wafer (COW). The semiconductor substrate 310 joined to the semiconductor substrate 210 is sealed by a sealing material 380 and the support substrate 160.

The semiconductor substrate removal region 190 in the drawing can be a region from which the insulating film 153, the protective film 152, the insulating film 141, and the semiconductor substrate 110 are removed, similarly to the semiconductor substrate removal region 190 in FIG. 3. An opening portion 272 is formed near the bond pad 225. The opening portion 272 is formed in a shape penetrating the wiring region 120, the wiring region 220*a*, and the semiconductor substrate 210. The wire bonding can be performed on the bond pad 225 via the opening portion 272.

Note that a penetrating insulating portion 218 is disposed around the opening portion 272 of the semiconductor substrate 210. The penetrating insulating portion 218 can be formed in a shape surrounding the opening portion 272. By disposing the penetrating insulating portion 218, a surface of the semiconductor substrate 210 in contact with the opening portion 272 can be insulated.

The configuration of the imaging element 1 other than this is similar to the configuration of the imaging element 1 in the first embodiment of the present disclosure, and thus description is omitted.

As described above, in the imaging element 1 according to the fourth embodiment of the present disclosure, in a case where three or more semiconductor substrates are stacked, the bonding strength of the wire bonding and the bonding wire 90 can be measured by disposing the semiconductor substrate removal region 190.

5. Configuration Example of Imaging Device

The technology according to the present disclosure can be applied to various products. For example, the technology according to the present disclosure can be applied to an imaging device such as a camera.

Figure 13:
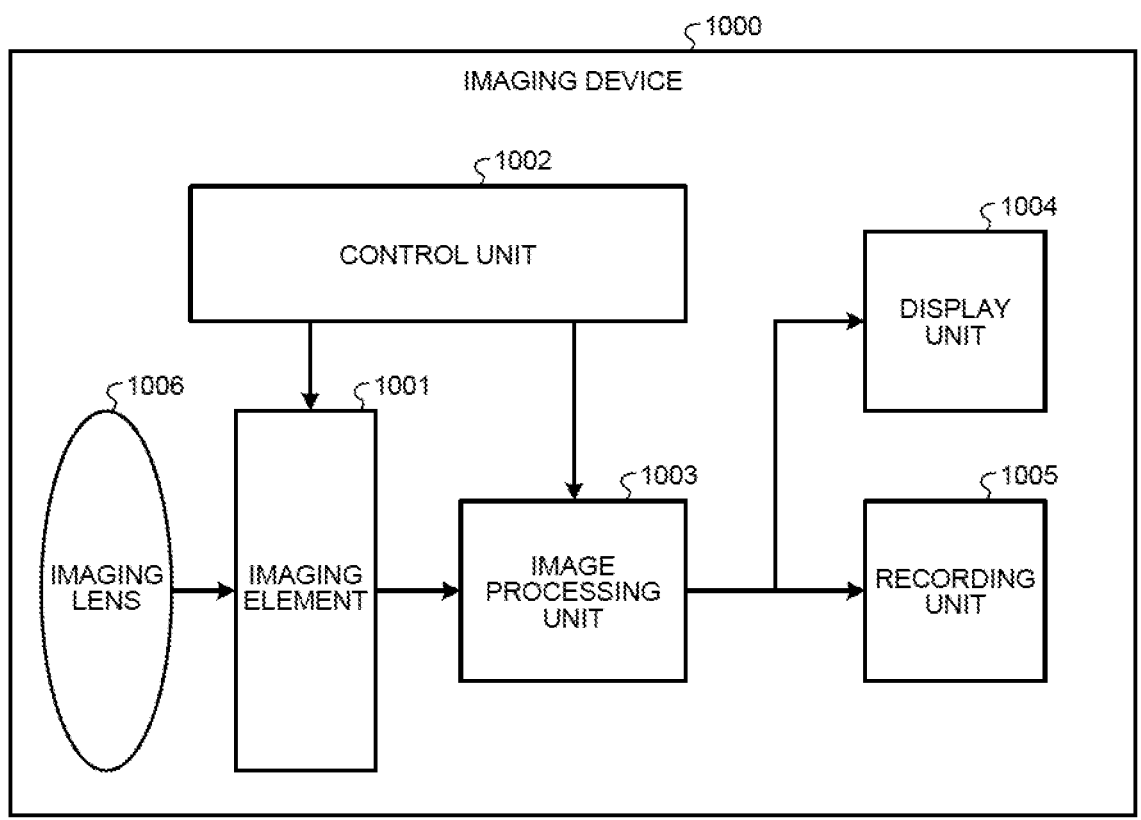
FIG. 13 is a view illustrating a configuration example of an imaging device to which the technology according to the present disclosure can be applied.

FIG. 13 is a view illustrating a configuration example of an imaging device to which the technology according to the present disclosure can be applied. An imaging device 1000 in the drawing includes an imaging element 1001, a control unit 1002, an image processing unit 1003, a display unit 1004, a recording unit 1005, and an imaging lens 1006.

The imaging lens 1006 is a lens that condenses light from a subject. The subject is imaged on the light receiving surface of the imaging element 1001 by the imaging lens 1006.

The imaging element 1001 is an element that images a subject. A plurality of pixels including a photoelectric conversion unit that performs photoelectric conversion of light from a subject is disposed on a light receiving surface of the imaging element 1001. Each of the plurality of pixels generates an image signal based on a charge generated by photoelectric conversion. The imaging element 1001 converts an image signal generated by the pixel into a digital image signal and outputs the digital image signal to the image processing unit 1003. Note that an image signal for one screen is referred to as a frame. The imaging element 1001 can also output an image signal in units of frames.

The control unit 1002 controls the imaging element 1001 and the image processing unit 1003. The control unit 1002 can include, for example, an electronic circuit using a microcomputer and the like.

The image processing unit 1003 processes an image signal from the imaging element 1001. The processing of the image signal in the image processing unit 1003 corresponds to, for example, demosaic processing of generating an image signal of a color that is insufficient when a color image is generated or noise reduction processing of removing noise of the image signal. The image processing unit 1003 can include, for example, an electronic circuit using a micro-computer and the like.

The display unit 1004 displays an image based on the image signal processed by the image processing unit 1003. The display unit 1004 can include, for example, a liquid crystal monitor.

The recording unit 1005 records an image (frame) based on the image signal processed by the image processing unit 1003. The recording unit 1005 can include, for example, a hard disk or a semiconductor memory.

The imaging device to which the present disclosure can be applied has been described above. The present technology can be applied to the imaging element 1001 among the above components. Specifically, the imaging element 1 described in FIG. 1 can be applied to the imaging element 1001. Note that the image processing unit 1003 is an example of a processing circuit described in the claims. The imaging device 1000 is an example of a semiconductor device described in the claims.

Note that the configuration of the second embodiment of the present disclosure can be applied to other embodiments. Specifically, the insulating film 153 in FIG. 7 can be applied to the third and fourth embodiments of the present disclosure.

The configuration of the third embodiment of the present disclosure can be applied to other embodiments. Specifically, the guard ring 126 in FIG. 9 can be applied to the second and fourth embodiments of the present disclosure.

(Effects)

The semiconductor element (imaging element 1) includes the semiconductor substrate 110 and the bond pad 125. In the semiconductor substrate 110, an element is formed, and the wiring region 120 having the wiring 122 for transmitting a signal of the element is disposed adjacent. The bond pad 125 is disposed in the wiring region 120 adjacent to the semiconductor substrate removal region 190, which is a region where the semiconductor substrate 110 is removed, connected to the wiring 122, and bonded with a connection portion (bonding wire 90) for connection to the outside. The semiconductor substrate removal region 190 includes a region for measuring the bonding strength of the bond pad 125 and the connection portion (bonding wire 90). As a result, the bonding strength of the bond pad 125 and the connection portion (bonding wire 90) can be measured.

In addition, the semiconductor substrate removal region 190 may include a region where the test instrument 500 that pushes and shears the connection portion (bonding wire 90) for measuring the bonding strength is disposed. As a result, it is possible to measure the bonding strength by the test instrument 500.

In addition, the semiconductor substrate removal region 190 may include a region where the connection portion (bonding wire 90) pushed for measuring the bonding strength moves. As a result, the connection portion (bonding wire 90) can be sheared for measuring the bonding strength.

In addition, the semiconductor device may further include the penetrating insulating portion 119 which is disposed near the semiconductor substrate removal region 190 and is formed of an insulator having a shape penetrating the semiconductor substrate 110. As a result, the side surface of the semiconductor substrate 110 can be insulated.

In addition, the semiconductor device may further include the insulating film 153 disposed on a surface of the semiconductor substrate 110 adjacent to the semiconductor substrate removal region 190. As a result, the side surface of the semiconductor substrate 110 can be insulated.

In addition, the semiconductor substrate removal region 190 may be a region from which the end portion of the semiconductor substrate 110 is removed. As a result, in the manufacturing process, the semiconductor substrate removal region 190 can be formed in common with the imaging element 1 disposed adjacent to the wafer.

In addition, a wiring region protection portion (guard ring 126) disposed along the end portion of the wiring region 120 may be further included. As a result, the end portion of the wiring region 120 can be protected.

In addition, the wiring region protection portion (guard ring 126) may be made of a metal member embedded in a surface of the wiring region 120 adjacent to the semiconductor substrate removal region 190. As a result, the end portion of the wiring region 120 can be protected by the metal member.

In addition, the plurality of bond pads 125 may be disposed in the wiring region 120, and the semiconductor substrate removal region 190 may be a region between the adjacent bond pads 125. As a result, the moving direction of the test instrument 500 at the time of measuring the bonding strength can be limited to one direction.

In addition, the bond pad may be disposed in the wiring region 220_b_ of the second semiconductor substrate (semiconductor substrate 210) stacked on the semiconductor substrate 110. As a result, it is possible to measure the bonding strength of the bond pad 225 and the connection portion (bonding wire 90) of the semiconductor element configured by stacking a plurality of semiconductor substrates.

The above effect is brought.

In addition, the opening portion 272 formed in the second semiconductor substrate (semiconductor substrate 210) for bonding the connection portion (bonding wire 90) to the bond pad 225 may be further provided. As a result, the connection portion (bonding wire 90) can be bonded via the opening portion 272.

In addition, the second semiconductor substrate (semiconductor substrate 210) may further include the penetrating insulating portion 218 that is disposed near the opening portion 272 of the second semiconductor substrate (semiconductor substrate) and includes an insulator having a shape penetrating the second semiconductor substrate (semiconductor substrate 210). As a result, the wall surface of the opening portion 272 of the second semiconductor substrate (semiconductor substrate 210) can be insulated.

In addition, the element may be a photoelectric conversion unit that performs photoelectric conversion of incident light. As a result, it is possible to measure the bonding strength between the bond pad 125 and the connection portion (bonding wire 90) of the imaging element 1 that performs photoelectric conversion of incident light.

In addition, the semiconductor device (imaging device 1000) includes the semiconductor substrate 110, the bond pad 125, and the processing circuit (image processing unit 1003). In the semiconductor substrate 110, an element is formed, and the wiring region 120 having the wiring 122 for transmitting a signal of the element is disposed adjacent. The bond pad 125 is disposed in the wiring region 120 adjacent to the semiconductor substrate removal region 190, which is a region where the semiconductor substrate 110 is removed, connected to the wiring 122, and bonded with a connection portion (bonding wire 90) for connection to the outside. The processing circuit (image processing unit 1003) processes the transmitted signal. The semiconductor substrate removal region 190 includes a region for measuring the bonding strength of the bond pad 125 and the connection portion (bonding wire 90). As a result, the bonding strength of the bond pad 125 and the connection portion (bonding wire 90) can be measured.

In addition, a method for manufacturing a semiconductor element (imaging element 1) is a method for manufacturing a semiconductor element (imaging element 1), the method including: a step of disposing a wiring region 120 on a semiconductor substrate 110 on which an element is formed, the wiring region including a wiring 122 that transmits a signal of the element and a bond pad 125 connected to the wiring 122 and to which a connection portion (bonding wire 90) for connection with an outside is bonded; and a step of removing the semiconductor substrate 110 in a region near the bond pad 125, in which in the step of removing the semiconductor substrate 110, the region including a region for measuring bonding strength between the bond pad 125 and the connection portion (bonding wire 90) is removed. As a result, the bonding strength of the bond pad 125 and the connection portion (bonding wire 90) can be measured.

Note that the effects described in the present specification are merely examples and are not limited, and other effects may be provided.

Note that the present technology can also have the configuration below.

(1) A semiconductor element comprising:
    a semiconductor substrate in which an element is formed and a wiring region having a wiring that transmits a signal of the element is disposed adjacent to the semiconductor substrate; and
    a bond pad disposed in the wiring region adjacent to a semiconductor substrate removal region, which is a region from which the semiconductor substrate has been removed, connected to the wiring, and bonded with a connection portion for connection to outside, wherein
    the semiconductor substrate removal region includes a region for measuring bonding strength between the bond pad and the connection portion.

(2) The semiconductor element according to the above (1), wherein the semiconductor substrate removal region includes a region where an instrument for pushing and shearing the connection portion for measurement of the bonding strength is disposed.

(3) The semiconductor element according to the above (1), wherein the semiconductor substrate removal region includes a region where the connection portion pushed for measuring the bonding strength moves.

(4) The semiconductor element according to any one of the above (1) to (3), further comprising a penetrating insulating portion disposed near the semiconductor substrate removal region and made of an insulator having a shape penetrating the semiconductor substrate.

(5) The semiconductor element according to any one of the above (1) to (4), further comprising an insulating film disposed on a surface of the semiconductor substrate adjacent to the semiconductor substrate removal region.

(6) The semiconductor element according to any one of the above (1) to (5), wherein the semiconductor substrate removal region is a region from which an end portion of the semiconductor substrate is removed.

(7) The semiconductor element according to the above (6), further comprising a wiring region protection portion disposed along an end portion of the wiring region.

(8) The semiconductor element according to the above (7), wherein the wiring region protection portion includes a metal member embedded in a surface of the wiring region adjacent to the semiconductor substrate removal region.

(9) The semiconductor element according to any one of the above (1) to (5), wherein
    a plurality of the bond pads is disposed in the wiring region, and
    the semiconductor substrate removal region is a region between the adjacent bond pads.

(10) The semiconductor element according to any one of the above (1) to (9), wherein the bond pad is disposed in a wiring region of a second semiconductor substrate stacked on the semiconductor substrate.

(11) The semiconductor element according to the above (10), further comprising an opening portion formed in the second semiconductor substrate for bonding the connection portion to the bond pad.

(12) The semiconductor element according to the above (11), further comprising a penetrating insulating portion disposed near the opening portion of the second semiconductor substrate and including an insulator having a shape penetrating the second semiconductor substrate.

(13) The semiconductor element according to any one of the above (1) to (12), wherein the element is a photoelectric conversion unit that performs photoelectric conversion of incident light.

(14) A semiconductor device comprising:
    a semiconductor substrate in which an element is formed and a wiring region having a wiring that transmits a signal of the element is disposed adjacent to the semiconductor substrate;
    a bond pad disposed in the wiring region adjacent to a semiconductor substrate removal region, which is a region from which the semiconductor substrate has been removed, connected to the wiring, and bonded with a connection portion for connection to an outside; and
    a processing circuit that processes the transmitted signal, wherein
    the semiconductor substrate removal region includes a region for measuring bonding strength between the bond pad and the connection portion.

(15) A method for manufacturing a semiconductor element, the method comprising:
    a step of disposing a wiring region on a semiconductor substrate on which an element is formed, the wiring region including a wiring that transmits a signal of the element and a bond pad connected to the wiring and to which a connection portion for connection with an outside is bonded; and
    a step of removing the semiconductor substrate in a region near the bond pad, wherein in the step of removing the semiconductor substrate, the region including a region for measuring bonding strength between the bond pad and the connection portion is removed.

REFERENCE SIGNS LIST 1, 1001 IMAGING ELEMENT
10 PIXEL ARRAY UNIT
30 COLUMN SIGNAL PROCESSING UNIT
90 BONDING WIRE
91 BONDING PORTION
100 PIXEL
110, 210, 310 SEMICONDUCTOR SUBSTRATE
119, 218, 219 PENETRATING INSULATING PORTION
120, 220a, 220b, 320 WIRING REGION
121, 221, 221a, 221b, 321 INSULATING LAYER
122, 222a, 222b, 322 WIRING
123 VIA PLUG
124 CONTACT PLUG
125, 225 BOND PAD
126 GUARD RING
152 PROTECTIVE FILM
153 INSULATING FILM
160 SUPPORT SUBSTRATE
171, 271, 272 OPENING PORTION
190 SEMICONDUCTOR SUBSTRATE REMOVAL REGION
191, 192 REGION
500 TEST INSTRUMENT
1000 IMAGING DEVICE

What is claimed is:

1. A semiconductor element, comprising:
a semiconductor substrate in which an element is formed and a wiring region having a wiring that transmits a signal of the element is disposed adjacent to the semiconductor substrate;
a bond pad disposed in the wiring region adjacent to a semiconductor substrate removal region, which is a region from which the semiconductor substrate has been removed, connected to the wiring, and bonded with a connection portion for connection to outside; and
a wiring region protection portion provided adjacent to the bond pad and extending above and below the adjacent pad in a vertical direction,
wherein the semiconductor substrate removal region includes a region for measuring bonding strength between the bond pad and the connection portion.

2. The semiconductor element according to claim 1, wherein the semiconductor substrate removal region includes a region where an instrument for pushing and shearing the connection portion for measurement of the bonding strength is disposed.

3. The semiconductor element according to claim 1, wherein the semiconductor substrate removal region includes a region where the connection portion pushed for measuring the bonding strength moves.

4. The semiconductor element according to claim 1, further comprising a penetrating insulating portion disposed near the semiconductor substrate removal region and made of an insulator having a shape penetrating the semiconductor substrate.

5. The semiconductor element according to claim 1, further comprising an insulating film disposed on a surface of the semiconductor substrate adjacent to the semiconductor substrate removal region.

6. The semiconductor element according to claim 1, wherein the semiconductor substrate removal region is a region from which an end portion of the semiconductor substrate is removed.

7. The semiconductor element according to claim 6, wherein the wiring region protection portion is disposed along an end portion of the wiring region.

8. The semiconductor element according to claim 7, wherein the wiring region protection portion includes a metal member embedded in a surface of the wiring region adjacent to the semiconductor substrate removal region.

9. The semiconductor element according to claim 1, wherein
a plurality of the bond pads is disposed in the wiring region, and
the semiconductor substrate removal region is a region between the adjacent bond pads.

10. The semiconductor element according to claim 1, wherein the bond pad is disposed in a wiring region of a second semiconductor substrate stacked on the semiconductor substrate.

11. The semiconductor element according to claim 10, further comprising an opening portion formed in the second semiconductor substrate for bonding the connection portion to the bond pad.

12. The semiconductor element according to claim 11, further comprising a penetrating insulating portion disposed near the opening portion of the second semiconductor substrate and including an insulator having a shape penetrating the second semiconductor substrate.

13. The semiconductor element according to claim 1, wherein the element is a photoelectric conversion unit that performs photoelectric conversion of incident light.

14. A semiconductor device, comprising:
a semiconductor substrate in which an element is formed and a wiring region having a wiring that transmits a signal of the element is disposed adjacent to the semiconductor substrate;
a bond pad disposed in the wiring region adjacent to a semiconductor substrate removal region, which is a region from which the semiconductor substrate has been removed, connected to the wiring, and bonded with a connection portion for connection to an outside;
a wiring region protection portion provided adjacent to the bond pad and extending above and below the adjacent pad in a vertical direction; and
a processing circuit that processes the transmitted signal,
wherein the semiconductor substrate removal region includes a region for measuring bonding strength between the bond pad and the connection portion.

15. The semiconductor device according to claim 14, wherein the semiconductor substrate removal region includes a region where an instrument for pushing and shearing the connection portion for measurement of the bonding strength is disposed.

16. The semiconductor device according to claim 14, wherein the semiconductor substrate removal region includes a region where the connection portion pushed for measuring the bonding strength moves.

17. The semiconductor device according to claim 14, further comprising a penetrating insulating portion disposed near the semiconductor substrate removal region and made of an insulator having a shape penetrating the semiconductor substrate.

18. The semiconductor device according to claim 14, further comprising an insulating film disposed on a surface of the semiconductor substrate adjacent to the semiconductor substrate removal region.

19. The semiconductor device according to claim 14, wherein the semiconductor substrate removal region is a region from which an end portion of the semiconductor substrate is removed.

20. A method for manufacturing a semiconductor element, the method comprising:

a step of disposing a wiring region on a semiconductor substrate on which an element is formed, the wiring region including a wiring that transmits a signal of the element and a bond pad connected to the wiring and to which a connection portion for connection with an outside is bonded;

a step of disposing a wiring region protection portion adjacent to the bond pad provided above and below the adjacent pad in a vertical direction and a step of removing the semiconductor substrate in a region near the bond pad, wherein in the step of removing the semiconductor substrate, the region including a region for measuring bonding strength between the bond pad and the connection portion is removed.

\* \* \* \* \*